(12) United States Patent
Bauer et al.

(10) Patent No.: US 7,479,443 B2
(45) Date of Patent: Jan. 20, 2009

(54) GERMANIUM DEPOSITION

(75) Inventors: Matthias Bauer, Riederich (DE); Paul Brabant, Phoenix, AZ (US); Trevan Landin, Queen Creek, AZ (US)

(73) Assignee: ASM America Inc., Phoenix, AZ (US)

( * ) Notice: Subject to any disclaimer, the term of this patent is extended or adjusted under 35 U.S.C. 154(b) by 0 days.

(21) Appl. No.: 11/867,318

(22) Filed: Oct. 4, 2007

(65) Prior Publication Data

US 2008/0017101 A1    Jan. 24, 2008

Related U.S. Application Data

(62) Division of application No. 11/067,307, filed on Feb. 25, 2005, now Pat. No. 7,329,593.

(60) Provisional application No. 60/556,752, filed on Mar. 26, 2004, provisional application No. 60/548,269, filed on Feb. 27, 2004.

(51) Int. Cl.
*H01L 21/20* (2006.01)
*C30B 25/02* (2006.01)
*C30B 25/16* (2006.01)

(52) U.S. Cl. .................. 438/478; 438/935; 438/493; 117/89; 117/105; 117/936; 427/255.35

(58) Field of Classification Search ............. 438/478, 438/493, 505, 508, 933, 935; 117/89, 105, 117/936; 427/255.35
See application file for complete search history.

(56) References Cited

U.S. PATENT DOCUMENTS

| 5,221,556 A |   | 6/1993  | Hawkins et al. |
|---|---|---|---|
| 5,259,918 A |   | 11/1993 | Akbar et al.   |
| 5,308,788 A | * | 5/1994  | Fitch et al. ............ 117/86 |
| 5,879,970 A |   | 3/1999  | Shiota et al.  |
| 6,093,252 A |   | 7/2000  | Wengert et al. |
| 6,107,653 A | * | 8/2000  | Fitzgerald ............ 257/191 |
| 6,319,782 B1|   | 11/2001 | Nakabayashi    |
| 6,373,112 B1|   | 4/2002  | Murthy et al.  |

(Continued)

FOREIGN PATENT DOCUMENTS

EP    0858101    2/1998

(Continued)

OTHER PUBLICATIONS

"Physics of Thin Films", printed from http://www.uccs.edu/~tchriste.courses.PHYS549/549lectures.film2.html (Feb. 22, 2000).

(Continued)

*Primary Examiner*—M. Wilczewski
(74) *Attorney, Agent, or Firm*—Knobbe, Martens, Olson & Bear LLP

(57) ABSTRACT

A method comprises, in a reaction chamber, depositing a seed layer of germanium over a silicon-containing surface at a first temperature. The seed layer has a thickness between about one monolayer and about 1000 Å. The method further comprises, after depositing the seed layer, increasing the temperature of the reaction chamber while continuing to deposit germanium. The method further comprises holding the reaction chamber in a second temperature range while continuing to deposit germanium. The second temperature range is greater than the first temperature.

15 Claims, 19 Drawing Sheets

U.S. PATENT DOCUMENTS

| | | | |
|---|---|---|---|
| 6,429,098 B1* | 8/2002 | Bensahel et al. | 438/478 |
| 6,537,370 B1 | 3/2003 | Hernandez et al. | |
| 6,562,736 B2 | 5/2003 | Yanagawa et al. | |
| 6,592,942 B1 | 7/2003 | Van Wijck | |
| 6,633,066 B1 | 10/2003 | Bae et al. | |
| 6,635,110 B1* | 10/2003 | Luan et al. | 117/4 |
| 6,645,836 B2 | 11/2003 | Kanzawa et al. | |
| 6,875,279 B2 | 4/2005 | Chu et al. | |
| 6,900,115 B2 | 5/2005 | Todd | |
| 7,037,856 B1 | 5/2006 | Maa et al. | |
| 2002/0173130 A1 | 11/2002 | Pomerede et al. | |
| 2003/0045063 A1 | 3/2003 | Oda | |
| 2003/0082300 A1 | 5/2003 | Todd et al. | |
| 2003/0124818 A1 | 7/2003 | Luo et al. | |
| 2003/0157787 A1 | 8/2003 | Murthy et al. | |
| 2003/0190791 A1 | 10/2003 | Fischetti et al. | |
| 2003/0207127 A1 | 11/2003 | Murthy et al. | |
| 2003/0235931 A1 | 12/2003 | Wada et al. | |
| 2004/0092104 A1* | 5/2004 | Gunn et al. | 438/689 |
| 2004/0219735 A1 | 11/2004 | Brabant et al. | |
| 2005/0067377 A1* | 3/2005 | Lei et al. | 216/33 |
| 2005/0079692 A1 | 4/2005 | Samoilov et al. | |
| 2007/0044706 A1* | 3/2007 | Kang et al. | 117/8 |
| 2007/0117398 A1* | 5/2007 | Okada et al. | 438/710 |
| 2007/0134886 A1* | 6/2007 | Quevedo-Lopez et al. | 438/424 |

FOREIGN PATENT DOCUMENTS

| | | |
|---|---|---|
| WO | WO 01/41544 | 6/2001 |
| WO | WO 00/15885 | 3/2005 |

OTHER PUBLICATIONS

Bauer et al., "High Ge content photodetectors on thin SiGe buffers", *Materials Science and Engineering* B89:77-83 (2002).

Bauer et al., "Relaxed SiGe buffers with thicknesses below 0.1 µm", *Thin Solid Films* 369:152-156 (2000).

Bensahel et al., "Single-wafer processin of in-situ doped polycrystalline Si and $Si_{1-x}Ge_x$", *Solid State Technology*, pp. S5-S10 (Mar. 1998).

Cannon et al., "Tensile strained epitaxial Ge films on Si(100) substrates with potential application in *L*-band telecommunications", *Applied Physics Letters* 84:906-908 (2004).

Chui et al., "Ultrathin high-κ gate dielectric technology for germanium MOS applications", *IEEE 60th Annual Device Research Conference (DRC) Digest*, paper VII.B2, pp. 191-192 (2002).

Colace et al., "Efficient high-speed near-infrared Ge photodetectors integrated on Si substrates", *Applied Physics Letters* 76:1231-1233 (2000).

Colace et al., "Ge/Si(001) photodetector for near infrared light", *Solid State Phenomena* 54:55-58 (1997).

Colace et al., "Ge-on-Si approaches to the detection of near-infrared light", *IEEE Journal of Quantum Electronics* 35:1843-1852 (1999).

Colace et al., "Metal-Ge-Si diodes for near-infrared light detection", *Journal of Vacuum Science and Technology B* 17:465 (1999).

Colace et al., "Metal-semiconductor-metal near-infrared light detector based on epitaxial Ge/Si", *Applied Physics Letters* 72:3175-3177 (1998).

Currie et al., "Controlling threading dislocation densities in Ge on Si using graded SiGe layers and chemical-mechanical polishing", *Applied Physics Letters* 72:1718-1720 (1998).

Famà et al., "High performance germanium-on-silicon detectors for optical communications", *Applied Physics Letters* 81:586-588 (2002).

Fischetti et al., "Band structure, deformation potentials, and carrier mobility in strained Si, Ge, and SiGe alloys", *Journal of Applied Physics* 80:2234-2252 (1996).

Giovane et al., "Correlation between leakage current density and threading dislocation density in SiGe p-i-n diodes grown on relaxed graded buffer layers", *Applied Physics Letters* 78:541-543 (2001).

Hartmann et al., "Reduced pressure—chemical vapor deposition of Ge thick layers on Si(001) for 1.3-1.55-µm photodetection", *Journal of Applied Physics* 95:5905-5913 (2004).

Hull, R., "Metastable strained layer configurations in the SiGe/Si system", *EMIS Datareviews, Series No. 24: Properties of SiGe and SiGe:C*, edited by Erich Kasper et al., INSPEC (2000).

Ishikawa et al., "Strain-induced band gap shrinkage in Ge grown on Si substrate", *Applied Physics Letters* 82:2044-2046 (2003).

Jackson et al., "Gate-Self-Aligned p-Channel Germanium MISFET's", *IEEE Electron Device Letters* 12:605-607 (1991).

Kasper et al., "New virtual substrate concept for vertical MOS transistors", *Thin Solid Films* 336:319-322 (1998).

Kasper, "Prospects of SiGe Heterodevices", *Journal of Crystal Growth* 150:921-925 (1995).

Lee et al., "Electron mobility characteristics of n-channel metal-oxide-semiconductor field-effect transistors fabricated on Ge-rich single- and dual-channel SiGe heterostructures", *Journal of Applied Physics* 95:1550-1555 (2004).

Lee et al., "Growth of strained Si and strained Ge heterostructures on relaxed $Si_{1-x}Ge_x$ by ultrahigh vacuum chemical vapor deposition", *Journal of Vacuum Science and Technology B* 22:158-164 (2004).

Lee et al., "Strained Ge channel p-type metal-oxide-semiconductor field-effect transistors grown on $Si_{1-x}Ge_x$/Si virtual substrates", *Applied Physics Letters* 79:3344-3346 (2001).

Lee et al., "Strained Si/strained Ge dual-channel heterostructures on Relaxed $Si_{0.5}Ge_{0.5}$ for symmetric mobility *p*-type and *n*-type metal-oxide-semiconductor field-effect transistors", *Applied Physics Letters* 83:4202-4204 (2003).

Letertre et al., "Germanium-on-insulator (GeOI) structure realized by the Smart Cut™ technology", *MRS Proceedings*, vol. 809 (2004).

Li et al., "Selective growth of Ge on Si(100) through vias of $SiO_2$ nanotemplate using solid source molecular beam epitaxy", *Applied Physics Letters* 83:5032-5034 (2003).

Liu et al., "Silicidation-induced band gap shrinkage in Ge epitaxial films on Si", *Applied Physics Letters* 84:660-662 (2004).

Luan et al., "High-quality Ge epilayers on Si with low threading-dislocation densities", *Applied Physics Letters* 75:2909-2911 (1999).

Lyutovich et al., "Interaction between point defects and dislocations in SiGe", *Solid State Phenomena* 69-70:179-184 (1999).

Lyutovich et al., "Relaxed SiGe buffer layer growth with point defect injection", *Materials Science and Engineering* B71:14-19 (2000).

Lyutovich et al., "Thin buffers with high Ge content for *n*-MOSFETs", *Materials Science and Engineering* B89:341-345 (2002).

Masini et al., "High-performance p-i-n Ge on Si photodetectors for the near infrared: from model to demonstration", *IEEE Transactions on Electron Devices* 48:1092-1096 (2001).

Ni et al., "X-ray reciprocal space mapping studies of strain relaxation in thin SiGe layers ($\leq$100 nm) using a low temperature growth step", *Journal of Crystal Growth* 227-228:756-760 (2001).

Reinking et al., "Ge p-MOSFETs compatible with Si CMOS-technology", *Proceedings of the 29th ESSDERC* 99:300-303 (1999).

Samavedam et al., "High-quality germanium photodiodes integrated on silicon substrates using optimized relaxed graded buffers", *Applied Physics Letters* 73:2125-2127 (1998).

Schöllhorn et al., "Coalescence of germanium islands on silicon", *Thin Solid Films* 336:109-111 (1998).

Shang et al., "Electrical characterization of germanium *p*-channel MOSFETs", *IEEE Electron Device Letters* 24:242-244 (2003).

Thomas et al., "Structural characterization of thick, high-quality epitaxial Ge on Si substrates grown by low-energy plasma-enhanced chemical vapor deposition", *Journal of Electronic Materials* 32:976-980 (2003).

PCT International Search Report for PCT/US05/06150 mailed Jun. 19, 2008.

\* cited by examiner

FIG. 10
As-doped germanium
30 sccm arsine (1% in $H_2$)
mag.100x
resistivity 9 m$\Omega$·cm
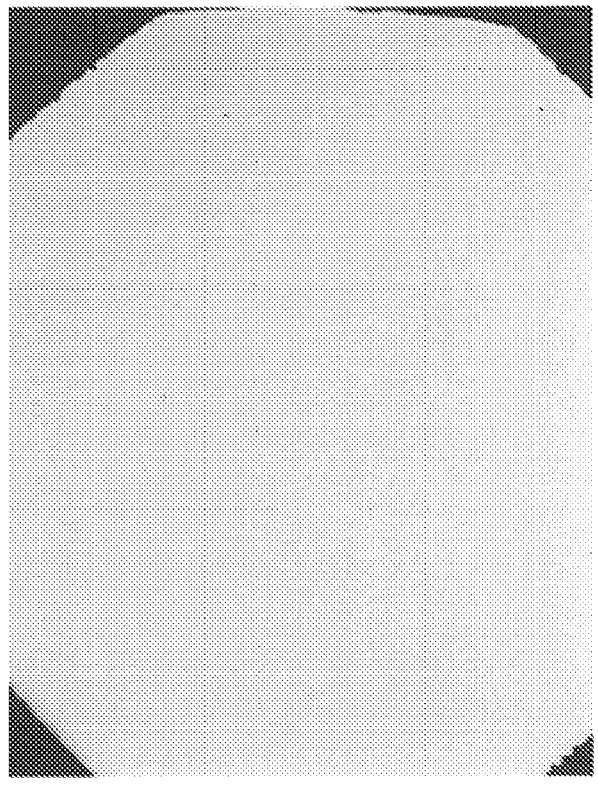
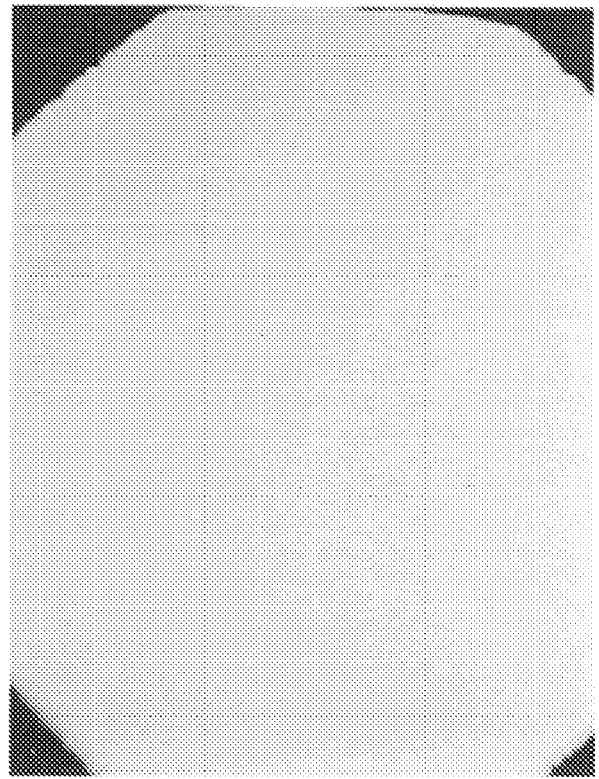

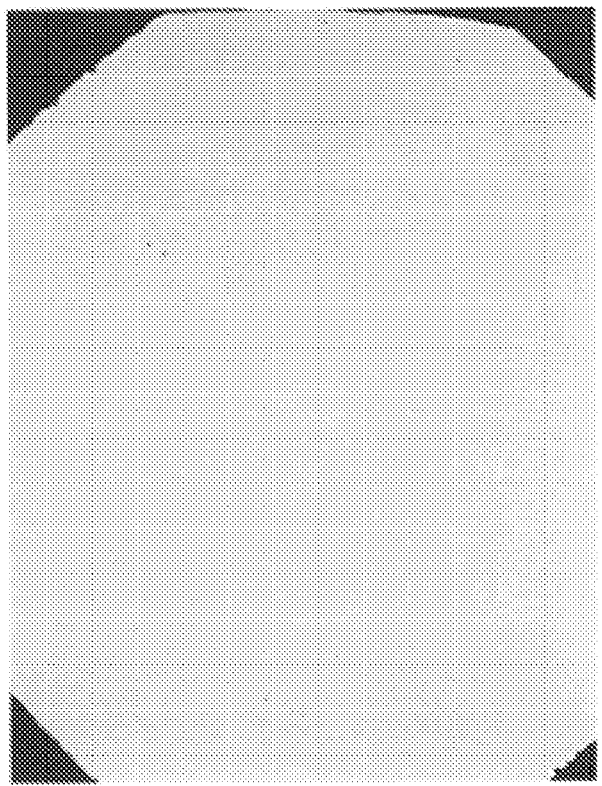
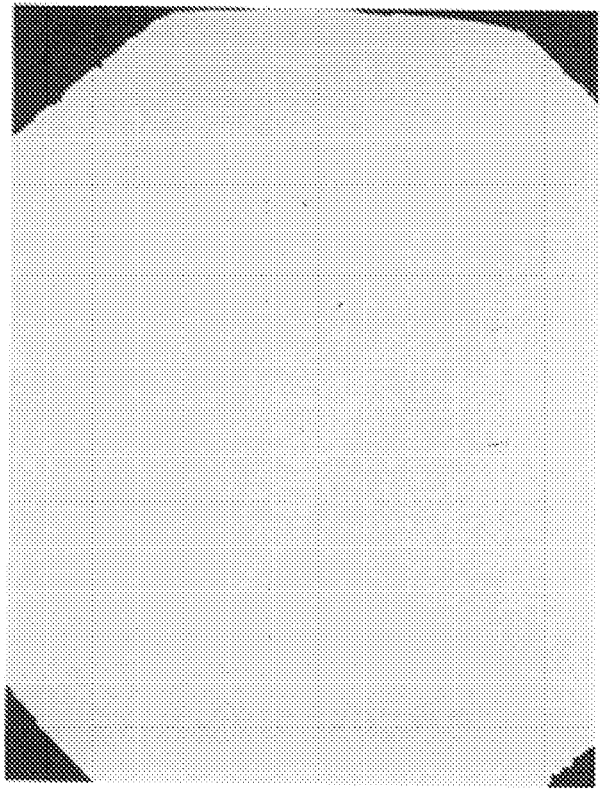
FIG. 11
P-doped germanium
1 sccm phosphine (1% in $H_2$)
mag.200x
resistivity 1.27 $m\Omega \cdot cm$ Intrinsic germanium
mag. 100x
resistivity 0.1 Ω·cm

GERMANIUM DEPOSITION

PRIORITY APPLICATION

This application is a divisional of U.S. patent application Ser. No. 11/067,307 (filed 25 Feb. 2005), which claims the benefit of U.S. Provisional Patent Application 60/548,269 (filed 27 Feb. 2004) and U.S. Provisional Patent Application 60/556,752 (filed 26 Mar. 2004). The entire disclosure of these priority applications is hereby incorporated by reference herein.

FIELD OF THE INVENTION

This invention relates generally to methods for depositing germanium films, and relates more specifically to high quality heteroepitaxial germanium films that are formable using production-worthy chemical vapor deposition equipment.

BACKGROUND OF THE INVENTION

Germanium is used in a wide variety of applications, such as optoelectronics and quantum bit computing. For example, germanium is particularly useful in the manufacture of photodetectors, since conventional silicon photodetectors cannot detect the near-infrared light that is used for optical communications. Germanium films also advantageously offer good electrical carrier transport properties for integrated circuit applications and compatibility with existing silicon technologies. However, pure germanium wafers are relatively expensive, and production-worthy techniques for forming germanium thin films having the physical characteristics that are used in many applications are not available. Examples of such physical characteristics include etch pit density and surface roughness.

For example, one issue that often arises during the production of germanium films, and that can compromise the physical characteristics of germanium films, is the lattice strain that results from heteroepitaxial deposition. A "heteroepitaxial" deposited layer is an epitaxial or single crystal film that has a different composition than the single crystal substrate onto which it is deposited. A deposited epitaxial layer is said to be "strained" when it is constrained to have a lattice structure in at least two dimensions that is the same as that of the underlying single crystal substrate, but different from its inherent lattice constant. Lattice strain occurs because the atoms in the deposited film depart from the positions that they would normally occupy in the lattice structure of the free-standing, bulk material when the film epitaxially deposits so that its lattice structure matches that of the underlying single crystal substrate.

Heteroepitaxial deposition of a germanium-containing material, such as silicon germanium or germanium itself, onto a single crystal silicon substrate—such as a wafer or an epitaxial silicon layer—generally produces compressive lattice strain because the lattice constant of the deposited germanium-containing material is larger than that of the silicon substrate. The degree of strain is related to the thickness of the deposited layer and the degree of lattice mismatch between the deposited material and the underlying substrate. Additionally, greater amounts of germanium generally increase the amount of strain in the germanium-containing layer. Specifically, the higher the germanium content, the greater the lattice mismatch with the underlying silicon, up to pure germanium, which has a 4% greater lattice constant compared to silicon.

As the thickness of the germanium-containing layer increases above a certain thickness, called the critical thickness, the germanium-containing layer relaxes automatically to its inherent lattice constant. This relaxation requires the formation of misfit dislocations at the film/substrate interface. The critical thickness depends partially upon temperature: that is, the higher the temperature, the lower the critical thickness. The critical thickness also depends partially on the degree of mismatch due to germanium content: that is, the higher the germanium content, the lower the critical thickness. For example, a SiGe film containing about 10% germanium has a critical thickness of about 300 Å at about 700° C. for an equilibrium (stable) strained film and about 2,000 Å for a metastable, strained film on Si <100>.

If the strain is to be maintained, the thickness is kept below the critical thickness and a cap layer is applied to the strained heteroepitaxial layer. The cap layer helps to maintain the metastable strain of the germanium-containing layer during subsequent processing steps. For example, in certain applications, this is done to facilitate the formation of an emitter-base junction at the desired depth within the structure. In other applications, such as when forming a buffer for subsequent strained deposition, the germanium layer is relaxed. Strained semiconductor layers advantageously exhibit enhanced electrical carrier mobility and therefore greater integrated circuit speed, but relaxed semiconductor layers are advantageous for forming buffer layers that set the crystal lattice for overlying strained semiconductor layers.

SUMMARY OF THE INVENTION

In accordance with the foregoing, improved methods have been developed to produce thin germanium films having physical characteristics that are advantageous for a wide variety of applications. For example, methods have been developed to deposit germanium-containing films, and particularly "pure" germanium-containing films, in a manner that minimizes certain types of dislocations, such as vertically propagating or "threading" dislocations. As used herein, "pure" germanium-containing films include both doped and un-doped germanium-containing films, but exclude alloys such as silicon germanium. In certain applications, threading dislocations disadvantageously lead to excessive surface roughness, reduced carrier mobility, current leakage, reduced device performance and device failure. Methods for producing germanium structures have previously involved use of expensive germanium wafers or ultra high vacuum chemical vapor deposition ("UHVCVD") techniques, both of which suffer from several disadvantages. In contrast, the improved techniques disclosed herein are compatible with conventional chemical vapor deposition ("CVD") production-worthy processing equipment, particularly with reduced pressure or atmospheric pressure equipment instead of UHVCVD equipment.

In one embodiment of the present invention, a method comprises, in a reaction chamber, depositing a seed layer of germanium over a silicon-containing surface at a first temperature. The seed layer has a thickness between about one monolayer and about 1000 Å. The method further comprises, after depositing the seed layer, increasing the temperature of the reaction chamber while continuing to deposit germanium. The method further comprises holding the reaction chamber in a second temperature range while continuing to deposit germanium. The second temperature range is greater than the first temperature.

In another embodiment of the present invention, a germanium film has a surface roughness of less than approximately 3 Å rms.

In another embodiment of the present invention, a method comprises, in a reaction chamber being held at a first pressure, depositing a seed layer of germanium over a silicon-containing surface at a first temperature. The method further comprises, after depositing the seed layer, increasing the temperature of the reaction chamber while continuing to deposit germanium. The method further comprises holding the reaction chamber in a second temperature range and at a second pressure while continuing to deposit germanium. The second temperature range is greater than the first temperature, and the second pressure is lower than the first pressure.

In another embodiment of the present invention, a method comprises providing a purge gas flow through a reaction chamber. The purge gas comprises $H_2$. The method further comprises depositing a seed layer of germanium over a silicon-containing surface at a first temperature while the purge gas is flowing through the reaction chamber at a first flow rate. The method further comprises, after depositing the seed layer, increasing the temperature of the reaction chamber while continuing to deposit germanium. The method further comprises holding the reaction chamber in a second temperature range while continuing to deposit germanium, and while flowing the purge gas through the reaction chamber at a second flow rate. The second temperature range is greater than the first temperature, and the second flow rate is greater than the first flow rate.

In another embodiment of the present invention, a method comprises, in a reaction chamber, depositing a seed layer of germanium over a silicon-containing surface at a first temperature. The method further comprises, after depositing the seed layer, increasing the temperature of the reaction chamber while continuing to deposit germanium. The method further comprises holding the reaction chamber in a second temperature range while continuing to deposit germanium. The second temperature range is greater than the first temperature. The method further comprises supplying a chlorine source to the reaction chamber while the reaction chamber is being held in the second temperature range.

In another embodiment of the present invention, a method comprises depositing a germanium film in a reaction chamber at a pressure between approximately 0.200 torr and 100 torr.

These and other embodiments are described in greater detail below.

BRIEF DESCRIPTION OF THE DRAWINGS

The embodiments of the present invention described herein will be readily apparent from the following description, and from the appended drawings, which are not necessarily drawn to scale. The drawings are intended to illustrate, and not limit, the present invention. The drawings comprise the following figures, in which like numerals indicate like parts.

FIG. 10 includes surface scans of etch pit decorated As-doped germanium films deposited in accordance with exemplary embodiments, with 30 sccm arsine (1% in $H_2$) supplied to the reaction chamber during film deposition; the film has less than $10^3$ defects $cm^{-2}$.

FIG. 11 includes surface scans of etch pit decorated P-doped germanium films deposited in accordance with exemplary embodiments, with 1 sccm phosphine (1% in $H_2$) supplied to the reaction chamber during film deposition; the film has less than $10^3$ defects $cm^{-2}$.

DETAILED DESCRIPTION OF PREFERRED EMBODIMENTS

The disclosure provided herein describes several methods for depositing germanium films, including germanium films having improved physical characteristics, such as surface roughness and etch pit density. Germanium films offer a lower cost alternative to germanium substrates. Using certain of the methods described herein, germanium films are deposited using conventional CVD processing equipment. In particular, the deposition occurs in a sufficiently high pressure regime such that the use of UHVCVD is not required, and that better quality films are obtained. In certain embodiments, the germanium films are deposited over a silicon-containing surface, such as a silicon substrate. The term "substrate," as used herein, refers to its ordinary meaning, as well as to a bare wafer or to such a workpiece with layers already formed thereon.

Although this disclosure refers to germanium films, and to illustrated embodiments and experiments conducted with "pure" germanium and doped "pure" germanium films, the techniques disclosed herein are also applicable to fabrication of films comprising germanium and other substances, including silicon and other dopants such as phosphorous, antimony, boron, gallium, and arsenic, and the like.

Figure 1:
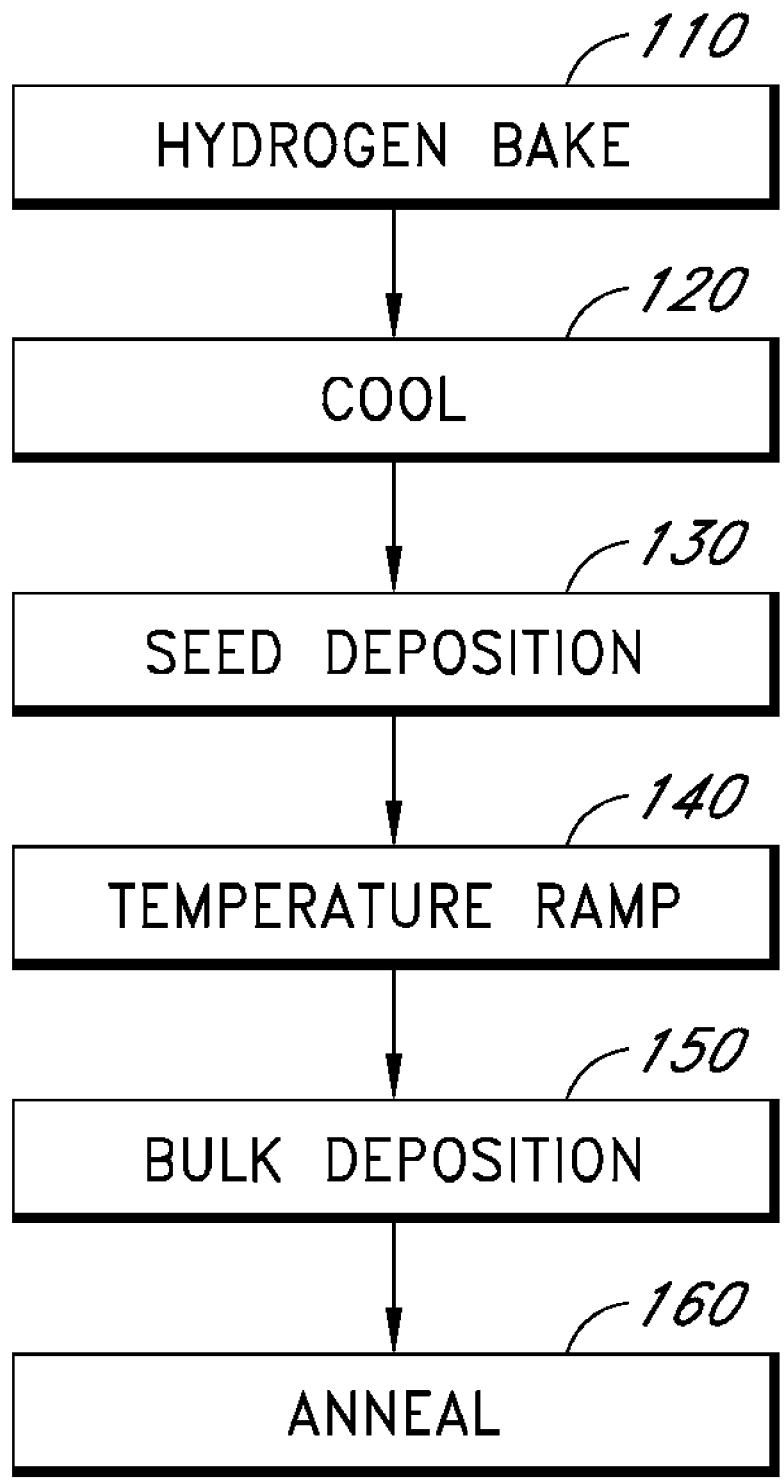
FIG. 1 is a flowchart illustrating an exemplary technique for forming germanium films, including operational blocks that are optional in certain embodiments.

An exemplary process for forming germanium films is illustrated in the flowchart of FIG. 1. As illustrated, this process includes an optional cleaning or native oxide reducing operation, such as a hydrogen bake operation 110 on a silicon-containing substrate. The bake operation 110 is followed by a subsequent cooling operation 120. A germanium film is then deposited over the silicon-containing substrate in a three-stage deposition process. In the first deposition stage, referred to herein as the seed deposition 130, a thin layer of germanium is deposited at low temperature. In the second deposition stage, referred to herein as the temperature ramp 140, the temperature is rapidly increased while the germanium precursor continues to flow, and while germanium deposition continues. In the third deposition stage, referred to herein as the bulk deposition 150, a thick layer of bulk germanium is formed over the germanium deposited during the seed deposition 130 and the temperature ramp 140. Further details regarding the conditions of deposition for these three deposition stages are provided herein. The process optionally includes a post-deposition anneal operation 160.

The processes disclosed herein are usable to form germanium films on a wide variety of substrates, such as silicon-containing substrates. In certain modified embodiments, germanium films are formed on substrates having a miscut, such as a miscut between approximately 4° and approximately 6°. Such embodiments are particularly useful in applications where III-V materials and/or materials that are highly p-type doped are to be subsequently deposited. For example, use of a miscut substrate help reduce the presence of antiphase boundaries.

Exemplary Processing Equipment.

Figure 2:
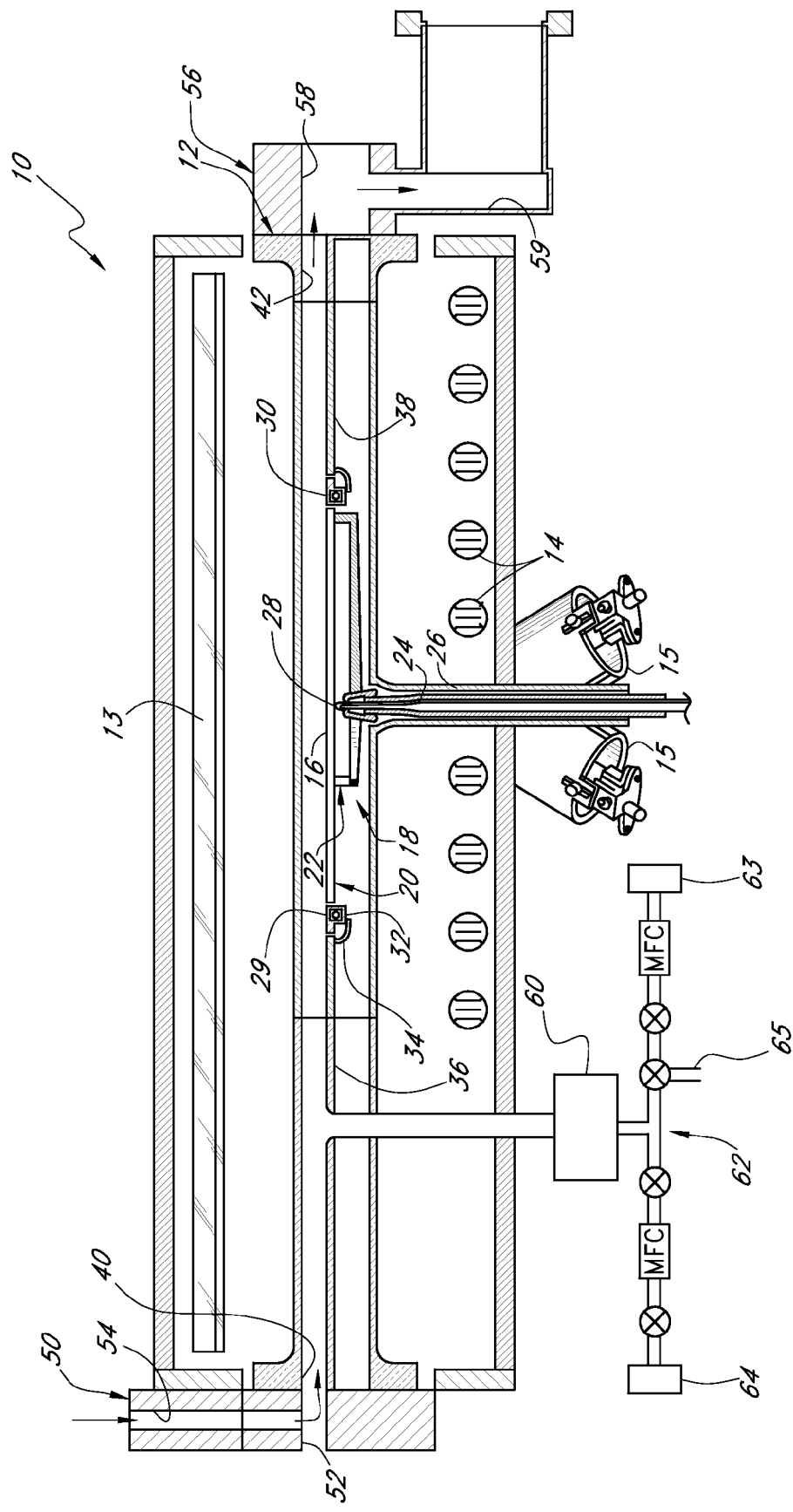
FIG. 2 is a schematic cross-sectional view of an exemplary single wafer chamber for processing wafers in accordance with certain embodiments disclosed herein.

The processes described herein are conducted in a suitable process chamber. Examples of suitable process chambers include batch furnaces and single wafer reactors. An exemplary chamber is a single wafer, horizontal gas flow reactor that is radiatively heated. Suitable reactors of this type are commercially available, and include the Epsilon® series of single wafer epitaxial reactors commercially available from ASM America, Inc. (Phoenix, Ariz.). FIG. 2 illustrates such a reactor, which is also described in greater detail in U.S. Patent Application Publication 2002/0173130 (published 21 Nov. 2002), the entire disclosure of which is hereby incorporated by reference herein.

In other embodiments, the processes described herein are performed in other reactors, such as in a reactor having a showerhead arrangement. Benefits in increased uniformity and deposition rates have been found particularly effective in the horizontal, single-pass, laminar gas flow arrangement of the Epsilon® chambers. A suitable manifold is used to supply the silicon precursor, surface active compound, and germanium precursor to the thermal CVD chamber in which the deposition is conducted. Gas flow rates are determined by routine experimentation, depending on the size of the deposition chamber. Such a reactor is capable of performing deposition operations at pressures between approximately 0.200 torr and 850 torr with chamber reinforcement, such as support ribs or curved quartz walls.

FIG. 2 illustrates an exemplary single wafer CVD reactor 10, including a quartz process or reaction chamber 12, constructed in accordance with an exemplary embodiment, and for which the methods disclosed herein have particular utility. While originally designed to optimize epitaxial deposition of silicon on a single substrate at a time, the inventors have found the superior processing control to have utility in CVD of a number of different materials, including silicon germanium and germanium films. Moreover, the illustrated reactor 10 is capable of safely and cleanly accomplishing multiple deposition steps in the same chamber 12. As noted above, the basic configuration of the reactor 10 is available commercially under the trade name Epsilon® from ASM America, Inc. (Phoenix, Ariz.).

A plurality of radiant heat sources is supported outside the chamber 12 to provide heat energy in the chamber 12 without appreciable absorption by the quartz chamber 12 walls. While the exemplary embodiments are described in the context of a "cold wall" CVD reactor for processing semiconductor wafers, the processing methods described herein have utility in conjunction with other heating and/or cooling systems, such as those employing inductive or resistive heating.

The illustrated radiant heat sources comprise an upper heating assembly of elongated tube-type radiant heating elements 13. In the illustrated embodiment, the upper heating elements 13 are disposed in spaced-apart parallel relationship and also are substantially parallel with the reactant gas flow path through the underlying reaction chamber 12. A lower heating assembly comprises similar elongated tube-type radiant heating elements 14 below the reaction chamber 12. In an exemplary embodiment, the lower heating elements 14 are oriented transverse to the upper heating elements 13. Desirably, a portion of the radiant heat is diffusely reflected into the chamber 12 by rough specular reflector plates (not shown) above and below the upper and lower heating elements 13, 14, respectively. Additionally, a plurality of spot lamps 15 supply concentrated heat to the underside of the substrate support structure (described herein). This counteracts a heat sink effect created by cold support structures extending through the bottom of the reaction chamber 12. In an exemplary embodiment, the elongated tube type heating elements 13, 14 are high intensity tungsten filament lamps producing radiant heat energy transmitted through the walls of the reaction chamber 12 without appreciable absorption. As is known in the art of semiconductor processing equipment, the power of the various lamps 13, 14, 15 is controllable independently or in grouped zones in response to temperature sensors.

A workpiece, for example comprising a silicon wafer 16, is shown supported within the reaction chamber 12 upon a substrate support structure 18. The illustrated support structure 18 includes a substrate holder 20, upon which the wafer 16 rests, and a support spider 22. The spider 22 is mounted to a shaft 24, which extends downwardly through a tube 26 depending from the chamber lower wall. In an exemplary embodiment, the tube 26 communicates with a source of purge or sweep gas which optionally flows during processing, thereby inhibiting process gases from escaping to the lower section of the chamber 12. In an exemplary embodiment, sweep gas also flows horizontally beneath the wafer to aid in reducing or minimizing contaminant leakage from below.

A plurality of temperature sensors is positioned in proximity to the wafer 16. The temperature sensors take any of a variety of forms, such as optical pyrometers or thermocouples. In the illustrated embodiment, the temperature sensors comprise thermocouples, including a first or central thermocouple 28, suspended below the substrate holder 20 in a suitable fashion. The illustrated central thermocouple 28 passes through the spider 22 in proximity to the substrate holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). In an exemplary embodiment, the peripheral thermocouples is housed within a slip ring 32, which surrounds the substrate holder 20 and the wafer 16. The central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By reducing or minimizing edge losses, the slip ring 32 helps reduce the risk of radial temperature non-uniformities across the wafer 16. In an exemplary embodiment, the slip ring 32 is suspended by a suitable means. For example, the illustrated slip ring 32 rests upon elbows 34, which depend from a front chamber divider 36, and a rear chamber divider 38. In an exemplary embodiment, the chamber dividers 36, 38 are formed of quartz. In some arrangements, the rear divider 38 is omitted.

The illustrated reaction chamber 12 includes an inlet port 40 for the injection of reactant and carrier gases. In other embodiments the wafer 16 is received through the inlet port 40. An outlet port 42 is on the opposite side of the chamber 12, with the wafer support structure 18 positioned between the inlet port 40 and outlet port 42.

An inlet component 50 is fitted to the reaction chamber 12, adapted to surround the inlet port 40, and includes a horizontally elongated slot 52 through which the wafer 16 is insertable. A generally vertical inlet 54 receives gases from gas sources and communicates such gases with the slot 52 and the inlet port 40. The gas sources in an exemplary embodiment include hydrogen, silicon and germanium precursors. Controls, such as a preprogrammed computer, are provided and configured to conduct a sequence of steps as described herein. The vertical inlet 54 optionally includes gas injectors as described in U.S. Pat. No. 5,221,556 (issued 22 Jun. 1993), or as described with respect to FIGS. 21-26 of U.S. Pat. No. 6,093,252 (issued 25 Jul. 2000), the entire disclosures of which are hereby incorporated herein by reference. Such injectors are designed to increase or maximize uniformity of gas flow for the single-wafer reactor.

An outlet component 56 similarly mounts to the process chamber 12 such that an exhaust opening 58 aligns with the outlet port 42 and leads to exhaust conduits 59. The conduits 59, in turn, communicate with suitable vacuum generation equipment (not shown) for drawing process gases through the chamber 12. In an exemplary embodiment, process gases are drawn through the reaction chamber 12 and a downstream scrubber (not shown). In such embodiments, a pump or fan is included to aid in drawing process gases through the chamber 12, and to evacuate the chamber for reduced pressure processing, that is, at below atmospheric pressure but above UHVCVD pressure ranges, as discussed herein.

In an exemplary embodiment, the illustrated reactor 10 also includes a source 60 of excited species that is positioned upstream from the chamber 10. The excited species source 60 of the illustrated embodiment comprises a remote plasma generator, including a magnetron power generator and an applicator along a gas line 62. An exemplary remote plasma generator is available commercially under the trade name TR-850 from Rapid Reactive Radicals Technology (R3T) GmbH (Munich, Germany). In the illustrated embodiment, microwave energy from a magnetron is coupled to a flowing gas in an applicator along a gas line 62. A precursor gas source 63 is coupled to the gas line 62 for introduction into the excited species source 60. A carrier gas source 64 is also coupled to the gas line 62. One or more further branch lines 65 is optionally provided for additional reactants. In certain embodiments, the gas sources 63, 64 comprise gas tanks, bubblers, and so forth, depending upon the form and volatility of the reactant species. Each gas line is provided with a separate mass flow controller ("MFC") and valves, as shown, to allow selection of relative amounts of carrier and reactant species introduced to the excited species source 60 and thence into the reaction chamber 12. The excited species generator is optionally employed for plasma enhanced deposition, and for exciting etchants for cleaning the chamber 12 of excess deposition when no wafer is housed in the chamber 12.

The total volume capacity of an exemplary single-wafer process chamber 12 designed for processing 200 mm wafers is preferably less than about 30 liters, more preferably less than about 20 liters, and most preferably less than about 10 liters. The illustrated chamber 12 has a capacity of about 7.5 liters. However, because the illustrated chamber 12 is divided by the dividers 36, 38, the substrate holder 20, the slip ring 32, and the purge gas flowing from the tube 26, the effective volume through which process gases flow is around half the total volume (about 3.77 liters in the illustrated embodiment). In other embodiments the volume of the single-wafer process chamber 12 is different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300 mm wafer processing chamber has a total volume of about 24 liters, with an effective processing gas capacity of about 11.83 liters.

Bake Operation and Subsequent Cool.

The quality of a deposited epitaxial layer generally depends on the cleanliness and crystal quality of the substrate onto which it is deposited. Since the substrate surface acts as a template for the deposited layer, substrate surface contamination tends to degrade the quality of the deposited layer. Many epitaxial deposition processes employ a so-called "bake" step in which the substrate is heated to drive off surface contaminants such as oxygen and carbon prior to epitaxial deposition.

In an exemplary embodiment, the bake operation 110 is carried out at a significantly higher temperature than that used for the subsequent deposition of the germanium film. Therefore, as illustrated in FIG. 1, there is a cooling operation 120 after the bake operation 110. In an exemplary embodiment, during cooling operation 120, the surface of the silicon-containing substrate is kept substantially free of contamination, for example by oxygen or carbon. While UHVCVD systems reduce the quantity of contaminants reaching the substrate surface, such systems are not always convenient, and are often expensive to operate.

For example, to prepare a single crystal silicon substrate for epitaxial germanium deposition, the silicon substrate is typically cleaned by baking at a first temperature that is preferably about 450° C. or higher, more preferably about 600° C. or higher, and in the illustrated embodiment at about 900° C. or higher. In one embodiment, the substrate is held at the first temperature for approximately two minutes. The substrate is then cooled to a second temperature during the cooling operation 120. The second temperature is a temperature that is lower than the first temperature. In exemplary embodiments, the single crystal silicon substrate is preferably cooled to a temperature of less than about 600° C., and more preferably less than about 450° C., before germanium deposition commences. In an exemplary embodiment, the substrate is cooled from the first temperature to the second temperature at between approximately 1° C. sec$^{-1}$ and approximately 10° C. sec$^{-1}$. More preferably, the substrate is cooled from the first temperature to the second temperature at a rate of approximately 4° C. sec$^{-1}$. In an exemplary embodiment, the bake operation 110 and subsequent cooling operation 120 are performed at a chamber pressure between approximately 0.200 torr and approximately 850 torr. More preferably, the bake operation 110 and subsequent cooling operation 120 are performed at a chamber pressure between approximately 1 torr and approximately 100 torr. Most preferably, the bake operation 110 and subsequent cooling operation 120 are performed at a chamber pressure of approximately 10 torr.

Deposition of epitaxial germanium onto single crystal silicon at temperatures above 450° C. using germane tends to result in incomplete surface coverage for relatively thin films, and in rough surfaces for relatively thick films. This results from the formation of clusters or islands of deposited germanium atoms early in the deposition process. Therefore, deposition using germane is preferably conducted at temperatures in the range of about 300° C. to about 450° C., and more preferably in the range of about 300° C. to about 350° C. Temperature dependence of the islanding effect is illustrated, for example, in Schöllhorn et al., "Coalescence of Germanium Islands on Silicon," *Thin Solid Films*, Vol. 336 (1998), pp. 109-111.

In conventional germanium deposition systems, the cleaned silicon substrate is generally maintained under vacuum during cooling to minimize surface contamination, and subsequent germanium deposition is typically conducted at very low pressures by UHVCVD or molecular beam epitaxy ("MBE"). However, such low pressure deposition is often slower than desired for many fabrication processes, and is impractical for production-worthy single wafer deposition tools. Moreover, the resulting single crystal germanium film typically has a relatively high level of defects. For example, an etch pit density of about $10^{10}$ defects cm$^{-2}$ has been reported for an epitaxially-deposited germanium film over a silicon substrate using UHVCVD. The defect density was reduced to about $10^7$ defects cm$^{-2}$ by annealing, but in some process flows the additional annealing step is disadvantageous.

In one embodiment, the high temperature silicon-containing surface is protected from contamination during cooling by contacting the silicon-containing surface—for example, an epitaxial silicon substrate—with a surface active compound. In certain embodiments, the surface active compound also assists in the sublimation of native oxides. In an exemplary embodiment, the contacting of the surface active compound with the silicon-containing substrate during the cooling period is carried out by flowing or diffusing the surface active compound across the surface of the substrate. Routine experimentation is used to select a flow rate that supplies an amount of surface active compound to the surface that is effective to reduce or avoid contamination during cooling. In certain embodiments, the contact between the surface active compound and the substrate is initiated simultaneously with the initiation of cooling, before cooling is initiated, or after cooling is initiated. The surface active compound is contacted with the substrate during the entire cooling process, or optionally during only a portion of the cooling process.

Preferably, the surface active compound is a silicon or germanium source chemical, and more preferably the surface active compound is a silicon source chemical. For example, in one embodiment, the surface active compound is dichlorosilane ("DCS"). In another embodiment, the surface active compound is approximately 100% silane provided to the reaction chamber at between approximately 1 sccm and approximately 10 sccm. More preferably, the surface active compound is approximately 100% silane provided to the reaction chamber at between approximately 5 sccm and approximately 10 sccm. The surface active compound is contacted with the silicon-containing surface during at least a portion of the time that the surface is cooling. The term "surface active compound" refers to a chemical compound that protects a single crystal silicon-containing surface from contamination without substantially interfering with the epitaxial or heteroepitaxial deposition of a subsequent layer.

In an exemplary embodiment, a thin silicon-containing layer is deposited during the cooling operation 120. The silicon-containing layer is a thickness between approximately one atomic monolayer and approximately 500 Å. It has been found that smaller amounts of silicon are deposited during an exemplary cooling step from about 900° C. to about 350° C. when the surface active compound is contacted with the single crystal silicon during only a portion of the cooling period, for example, from about an intermediate temperature of about 700° C. down to the germanium deposition temperature of about 350° C. Preferably, contact between the single crystal silicon and the dichlorosilane begins after cooling to an intermediate temperature of about 600° C. to about 800° C., and more preferably after cooling to about 650° C. or higher. This helps to avoid contamination during the further cooling in a lower temperature period from the intermediate temperature down to the germanium deposition temperature. The further cooling tends to be slower and desorption and/or reduction of contaminants tends to be less effective during this period. Additional information regarding the provision of silicon- and germanium-containing compounds during chamber cooling and before low temperature epitaxy is provided in U.S. Patent Application Publication 2004/0219735 (published 4 Nov. 2004), the entire contents of which is hereby incorporated by reference herein.

Without being limited by theory, the surface active compounds may exert their surface protective effect by various mechanisms. One possible mechanism is that the surface active compound forms a physisorbed protective layer on the surface that limits the ability of oxygen and carbon to contaminate the surface. In this mechanism, the surface active compound does not form a permanent chemical bond to the surface, and thus is easily displaced by the silicon and/or germanium precursor or precursors used to deposit the next layer. Surface active compounds acting by this mechanism preferably contain silicon or germanium, but the presence of these particular elements is not required because the subsequent displacement of the surface active compound reduces or eliminates the potential for surface contamination by other elements in the surface active compound.

Another possible mechanism may be operative in surface active compounds that contain silicon, germanium, and/or additional ligands. During cooling, the silicon or germanium in the surface active compound forms a chemical bond to the silicon-containing surface in a process known as chemisorption. Multiple layers of the surface active compound may be deposited on the surface during the cool down. At least a portion of the ligand or ligands in the surface active compounds are then displaced, for example, by the silicon and/or the germanium precursor or precursors used to deposit the next layer, and/or by a third component that removes part or all of the surface active compound. When only a portion of the surface active compound is removed, some of the silicon or germanium originally in the surface active compound is then incorporated into the resulting layer formed by subsequent deposition using silicon and/or germanium precursor or precursors. Other mechanisms may also be operative. Thus, while discussion of the various embodiments herein may include a reference to a particular operative mechanism, it will be understood that such reference is for the purposes of illustration and that other mechanisms may be operative in a particular situation.

Regardless of the operative mechanism, it has been found that such surface active compounds decrease or prevent surface contamination and thus improve the quality of subsequently deposited germanium-containing materials, such as epitaxial germanium and silicon germanium. In an exemplary embodiment, the surface active compound undergoes little or no thermal decomposition under the conditions and during the time that the silicon-containing surface is cooling, so that deposition on the silicon-containing surface during that time is minimized or avoided. Furthermore, the surface active compound is selected to not condense on the silicon-containing surface during cooling.

Regardless of the operative mechanism, in an exemplary embodiment the surface active compound is a silane (for example, silane, disilane, or trisilane), a germane (for example, germane, digermane), a halogermane (for example, chlorogermanes), an organosilane (for example, alkylsilane, arylsilane, or alkylarylsilane), or a halosilane (for example, chlorosilanes such as dichlorosilane and trichlorosilane) that does not undergo significant thermal decomposition at the temperature and pressure conditions present during cooling. Depending on the cooling conditions, exemplary surface active compounds include silane, disilane, trisilane, chlorosilane, dichlorosilane, trichlorosilane, tetrachlorosilane, methylsilane, dimethylsilane, trimethylsilane, tetramethylsilane, germane, digermane, dichlorogermane, trichlorogermane, tetrachlorogermane, and so forth.

In embodiments wherein silicon-containing compounds are used for the surface active compound, deposition during the cooling operation 120 will be reduced or minimized, and deposited silicon will have a reduced tendency (as compared to germanium) to agglomeration during the cooling from high temperatures. However, use of certain halogermanes (for example, chlorogermanes) as the surface active compound advantageously will exhibit reduced or minimal germanium deposition during the cooling operation 120. DCS and dichlorogermane have been found particularly effective in experiments, as discussed further herein. In modified embodiments, mixtures of the above-noted chemicals are used.

Purge Gas Flow.

During the hydrogen bake operation 110, the cooling operation 120 and the subsequent deposition operations, a purge gas is optionally flowed along the reactor walls. This purge gas flow is configured to move contaminants away from the surface of the substrate, and to reduce the formation of products of oxidation on the substrate surface before or during the formation of the germanium film. The purge gas flow effectively blankets the reactor with a "shield" of gas, and reduces the amount of oxygen and water vapor in contact with the substrate surface. In one embodiment, the purge gas flow comprises a high flow rate of high purity hydrogen gas along the reactor walls. Preferably, the purge gas flow comprises hydrogen gas provided at between approximately 5 slm and approximately 200 slm, more preferably at between approximately 10 slm and approximately 150 slm, and most preferably at between approximately 50 slm and approximately 100 slm. Hydrogen also advantageously acts as a reducing agent for the bake operation 110 and during the other operations. Purge gases other than hydrogen are optionally used for other deposition systems, such as polycrystalline deposition systems.

Seed Deposition.

As described above, one embodiment of a germanium film fabrication technique begins with a seed deposition 130. As illustrated in FIG. 1, the seed deposition 130 is initiated when the reaction chamber cools to an appropriate temperature, for example after the cooling operation 120. In an exemplary embodiment, the seed deposition 130 begins at a temperature sufficiently low to reduce or avoid islanding of the deposited material. Preferably, the seed deposition 130 begins at less than approximately 450° C. In another embodiment, the seed deposition operation 130 begins at less than approximately 350° C. In another embodiment, the seed deposition operation 130 begins at approximately 330° C. More preferably, the seed deposition operation 130 begins at between approximately 330° C. and approximately 370° C. In another embodiment, the seed deposition operation 130 begins at between approximately 330° C. and approximately 450° C. Generally, lower deposition temperatures tend to be more appropriate as the thermal stability of the germanium precursor decreases. The purge gas flow is optionally continued during the seed deposition operation.

In one embodiment, a germanium layer having a thickness between approximately one atomic monolayer and approximately 1000 Å is deposited during the seed deposition 130. In another embodiment, a germanium layer having a thickness between approximately two atomic monolayers and approximately 1000 Å is deposited during the seed deposition 130. In a preferred embodiment, the germanium layer deposited during the seed deposition 130 is between approximately 3 Å and approximately 600 Å thick. In one embodiment, between approximately 200 sccm and approximately 1 slm of a 10% germanium precursor (for example, stored as 10% $GeH_4$ and 90% $H_2$) is supplied to the reaction chamber during the seed deposition 130. Other germanium sources are used in other embodiments, such as digermane, trigermane, and chlorinated germanium sources, with appropriate adjustment of flow rate, deposition temperature and pressure as discussed herein.

The pressure in the reaction chamber during the seed deposition 130 is preferably between approximately 0.200 torr and approximately 850 torr. More preferably, the pressure in the reaction chamber during the seed deposition 130 is between approximately 1 torr and approximately 760 torr. More preferably, the pressure in the reaction chamber during the seed deposition 130 is between approximately 1 torr and approximately 100 torr. More preferably, the pressure in the reaction chamber during the seed deposition 130 is between approximately 10 torr and approximately 100 torr.

In one embodiment, the flow rate of the purge gas flow is reduced when the seed deposition 130 begins. In such embodiments, reduction of the purge gas flow reduces dilution of the germanium precursor, and therefore increases the growth rate of the germanium film. In one embodiment, the flow rate of the purge gas flow is reduced for the entire seed deposition 130, as compared to the pre-deposition bake and cooling operations and/or the bulk deposition 150. In another embodiment, the flow rate of the purge gas flow is reduced for a portion of the seed deposition 130, such as for example for the first approximately 3 to approximately 4 minutes of the seed deposition 130. In one embodiment, the purge gas flow is reduced to between 5 about slm $H_2$ and about 10 slm $H_2$ during the seed deposition 130.

Where a selective deposition process is to be performed, a reduced pressure advantageously reduces deposition rates on dielectric materials. In a preferred selective deposition embodiment, the pressure in the reaction chamber is between approximately 1 torr and approximately 100 torr. In a more preferred selective deposition embodiment, the pressure in the reaction chamber is between approximately 10 torr and approximately 20 torr. Selectivity is achievable on patterned wafers as deposition over silicon as compared to oxide even without any added etchant. In a modified embodiment, an etchant including chlorine, such as hydrochloric acid or $Cl_2$, is provided to the reaction chamber in a selective deposition process. For example, in one selective deposition process, a germanium film is selectively deposited into windows formed on the surface of a substrate. In still other embodiments, hydrochloric acid is provided to the reaction chamber in a blanket deposition process.

Preferably, the seed deposition has a duration between about 1.5 minutes and about 6 minutes. More preferably, the seed deposition has a duration between about 2 minutes and about 4 minutes. More preferably, the seed deposition has a duration between about 3 minutes and about 4 minutes. In one embodiment, the seed deposition has a duration of less than about three minutes.

Figure 7:
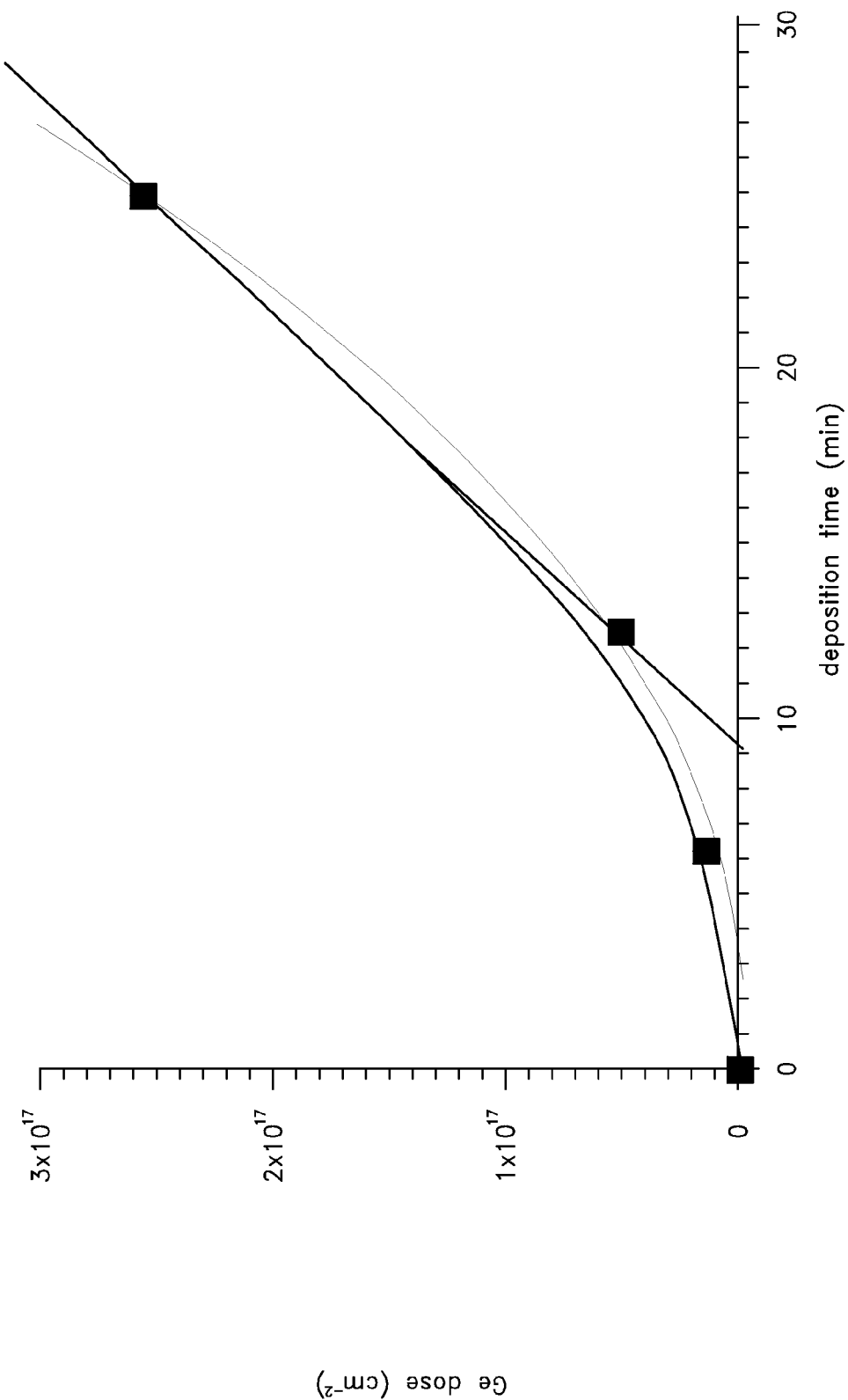
FIG. 7 is a graph illustrating amount of deposited germanium during a seed deposition as a function of time.

FIG. 7 provides a graph illustrating amount of deposited germanium as a function of deposition time during the seed deposition 130. The amount of deposited germanium is provided in [Ge] $cm^{-2}$. The data provided in FIG. 7 resulted from a seed deposition conducted at approximately 40 torr with a $GeH_4$ flow of approximately 100 sccm delivered to the reaction chamber. A hydrogen purge of approximately 20 slm was also provided.

Figure 19:
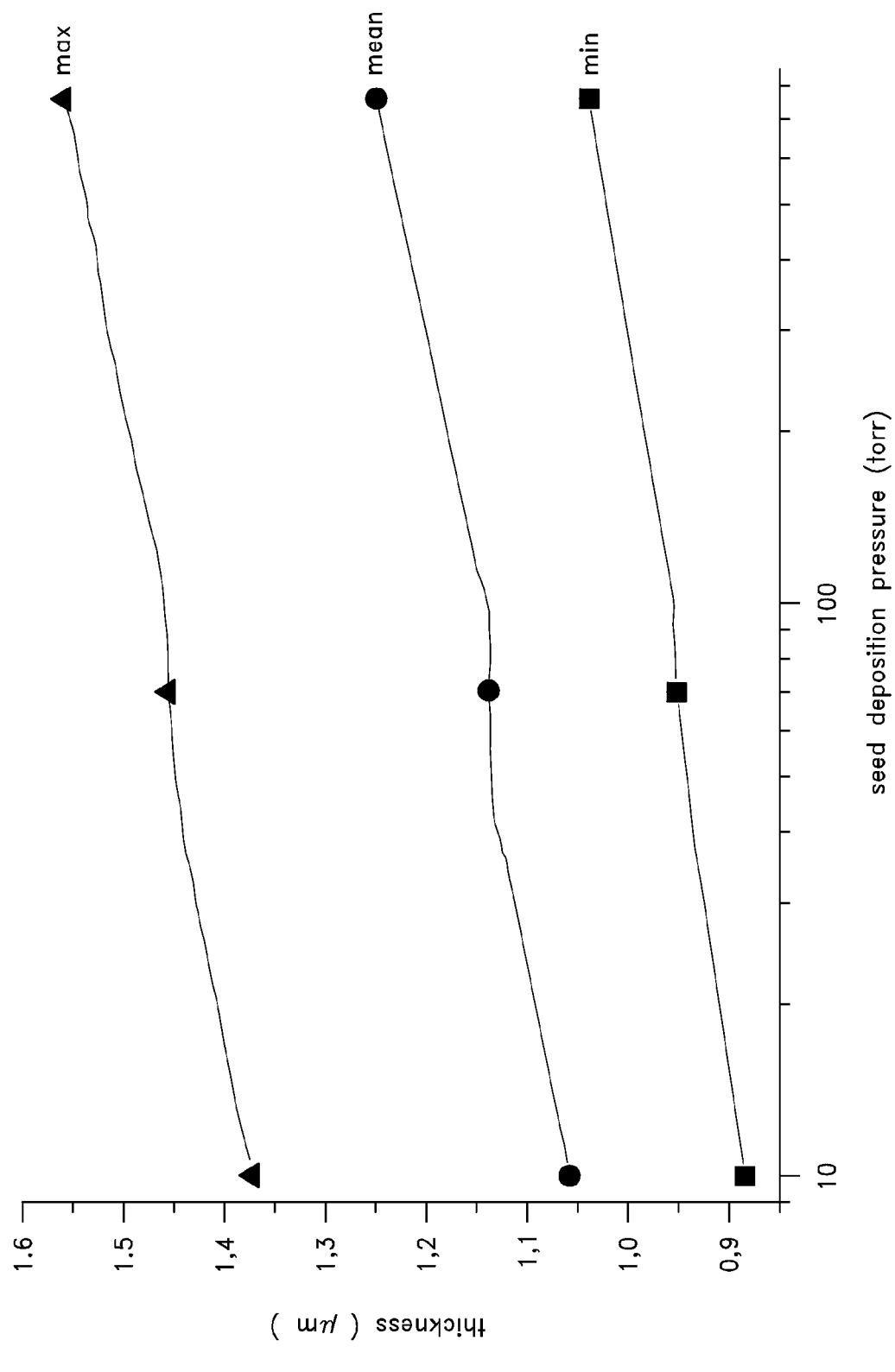
FIG. 19 is a graph illustrating seed layer thickness as a function of reaction chamber pressure during seed layer deposition.

FIG. 19 provides a graph illustrating seed layer thickness as a function of reaction chamber pressure during seed layer deposition. To obtain the data illustrated in FIG. 19, the seed deposition 130 was performed for an extended period of 12 minutes to exaggerate the effect that deposition pressure has on film thickness. FIG. 19 illustrates that the pressure in the reaction chamber during seed deposition can have a material effect on the deposition rate during the seed deposition 150.

Temperature Ramp.

Figure 3:
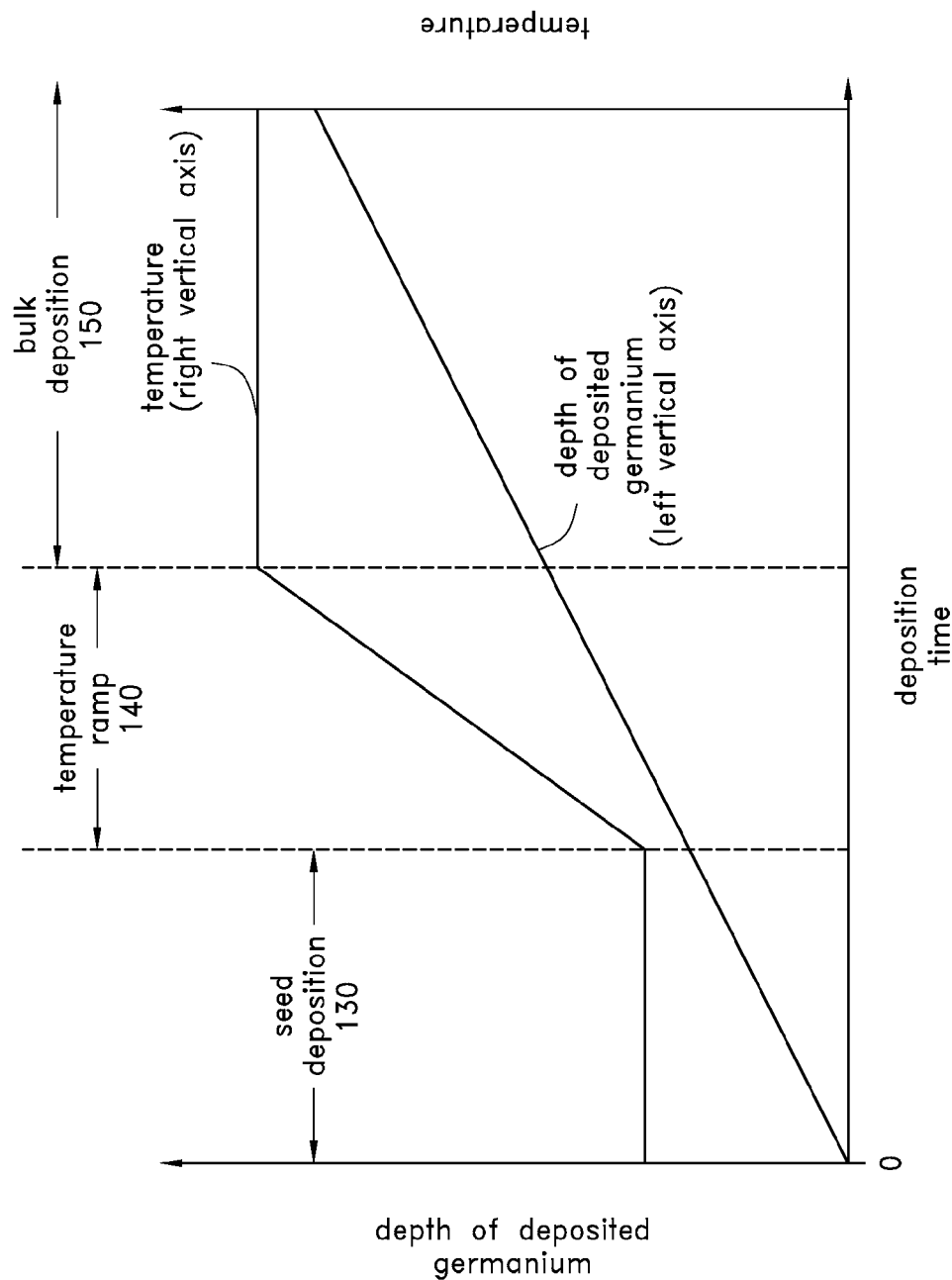
FIG. 3 is a graph illustrating both reaction chamber temperature and depth of a deposited germanium film as a function of deposition time.

Referring now to FIG. 3, deposition of the germanium film continues during the temperature ramp 140. For example, in one embodiment the flow rate of germanium precursor and the pressure in the deposition chamber are continued from the seed deposition 130. Preferably, the flow rate of germanium precursor into the deposition chamber during the temperature ramp 140 is between approximately 1% and approximately 200% of the flow rate during the seed deposition 130. More preferably, the flow rate of germanium precursor into the deposition chamber during the temperature ramp 140 is between approximately 10% and approximately 100% of the flow rate during the seed deposition 130. Most preferably, the flow rate of germanium precursor into the deposition chamber during the temperature ramp 140 is between approximately 50% and approximately 100% of the flow rate during the seed deposition 130. For example, deposition of germanium films has been demonstrated where the flow rate of the germanium precursor is substantially unchanged between the seed deposition 130 and the temperature ramp 140.

Although the germanium film growth rate illustrated in FIG. 3 is linear, in other embodiments, the growth rate is not linear. In one embodiment, a germanium layer having a thickness of approximately 300 nm is deposited during the temperature ramp 140. In another embodiment, a germanium layer having a thickness non-uniformity of less than approximately 1% is deposited during the temperature ramp 140. More preferably, a germanium layer having a thickness non-uniformity of less than approximately 0.5% is deposited during the temperature ramp 140.

Preferably, during the temperature ramp 140, the temperature is increased at a rate of between approximately 100° C. $min^{-1}$ and approximately 500° C. $min^{-1}$. More, preferably, the temperature is increased at a rate of between approximately 200° C. $min^{-1}$ and approximately 400° C. $min^{-1}$. Most preferably, the temperature is increased at a rate of approximately 300° C. $min^{-1}$. In one embodiment, the temperature is increased until non-mass-flow-limited deposition is possible. Preferably, the temperature is increased until a temperature between approximately 500° C. and approximately 938° C. is obtained. More preferably, the temperature is increased until a temperature between approximately 700° C. and approximately 900° C. is obtained. For example, in one embodiment, the temperature is increased until a temperature of approximately 800° C. is obtained.

In one embodiment, the flow rate of the purge gas flow is increased after the seed deposition 130. For example, in one embodiment the purge gas flow is increased from about 5 slm $H_2$ during the seed deposition 130 to 20-30 slm $H_2$ during at least a portion of the temperature ramp 140 and the bulk deposition 150. In another embodiment, the purge gas flow is increased by between 25 slm $H_2$ and 35 slm $H_2$ during the temperature ramp 140 and the bulk deposition 150. In certain embodiments, increasing the purge gas flow after the seed deposition advantageously counters depletion effects during subsequent deposition, thereby resulting in higher quality, faster growing germanium films.

Figure 6:
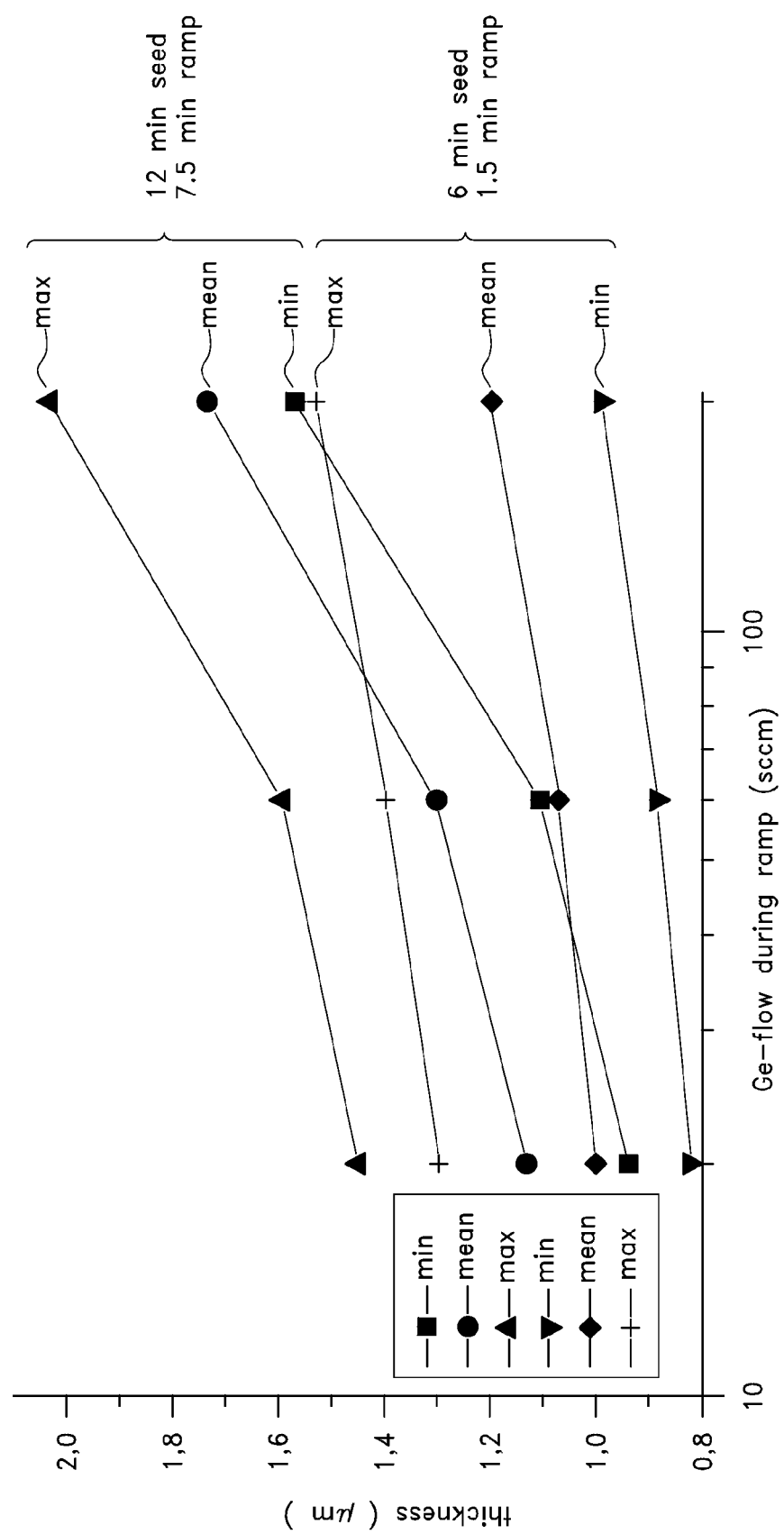
FIG. 6 is a graph illustrating overall germanium film thickness as a function of germanium precursor flow during the temperature ramp.

FIG. 6 provides a graph illustrating overall germanium film thickness as a function of germanium precursor flow during the temperature ramp 140. As illustrated, as the duration of the temperature ramp 140 increases, it is possible for the temperature ramp 140 to provide a significant contribution to the overall film thickness.

Bulk Deposition.

As illustrated in FIG. 1, after the temperature in the reaction chamber is increased during the temperature ramp 140, germanium deposition continues in bulk deposition 150. In an exemplary embodiment, the germanium deposition continues at a high temperature and at a substantially constant temperature. In an exemplary embodiment, the pressure in the deposition chamber during the bulk deposition 150 remains substantially unchanged as compared to the pressure during the seed deposition 130 and the temperature ramp 140. The germanium layer deposited during the bulk deposition 150 is typically relaxed, depending on the thickness previously deposited. In one embodiment, a germanium layer is grown at a rate of between approximately 500 Å $min^{-1}$ and approximately 900 Å $min^{-1}$ during the bulk deposition 150. In another embodiment, a germanium layer is grown at a rate of between approximately 500 Å $min^{-1}$ and approximately 700 Å $min^{-1}$ during the bulk deposition 150. After the bulk deposition 150, a germanium film having an aggregate thickness between approximately 50 nm and approximately 10 μm results. In another embodiment, a germanium film having an aggregate thickness between approximately 1 µm and approximately 2 µm results.

To improve smoothness of the germanium film, an etchant is optionally provided to the reaction chamber during the bulk deposition 150. In one embodiment, the etchant is hydrochloric acid. By planarizing the film surface, the "gliding" of threading dislocations is facilitated, thereby allowing a germanium film having a reduced etch pit density to be produced.

In certain embodiments, a chlorine source is optionally provided to the reaction chamber during the bulk deposition 150. In one embodiment the chlorine source is distinct from the germanium source, such as HCl or $Cl_2$. For example, in one such embodiment between about 25 sccm HCl and about 200 sccm HCl is provided to the reaction chamber during the bulk deposition 150. In another such embodiment between about 50 sccm HCl and about 100 sccm HCl are provided to the reaction chamber during the bulk deposition 150. In another embodiment, the chlorine source and the germanium source are provided by the same compound, such as by a chlorogermane. Examples of suitable chlorogermanes include, but are not limited to $GeCl_4$ and $GeH_2Cl_2$. Other chlorine sources are used in other embodiments.

In such embodiments, the chlorine source reduces depletion effects during the bulk deposition 150, thereby enhancing film uniformity and increasing the effect of precursor conversion, thereby resulting in higher quality, faster growing germanium films. Addition of a chlorine source during the bulk deposition 150 is optionally accompanied by a decrease in the purge gas flow rate. For example, in one embodiment the purge gas flow rate is decreased by between about 5 slm $H_2$ and about 15 slm $H_2$ during the bulk deposition 150. In certain embodiments, addition of a chlorine source—and optionally reduction of the purge gas flow rate—effectively increase the germanium growth rate during the bulk deposition by between about 10 nm $min^{-1}$ to about 20 nm $min^{-1}$.

In a modified embodiment, the pressure in the deposition chamber is reduced during the bulk deposition 150. For example, in one embodiment the pressure in the deposition chamber during the bulk deposition 150 is reduced from between about 80 torr to about 120 torr to between about 40 torr and about 10 torr.

In another embodiment, the pressure in the deposition chamber during the bulk deposition 150 is reduced to between about 20 torr and about 10 torr. In another embodiment, the pressure in the deposition chamber during the bulk deposition 150 is reduced by between about 90 torr and about 50 torr, as compared to the pressure in the deposition chamber during the temperature ramp. In another embodiment, the pressure in the deposition chamber during the bulk deposition 150 is reduced by between about 80 torr and about 60 torr, as compared to the pressure in the deposition chamber during the temperature ramp. As discussed above, reducing the pressure in the deposition chamber during the bulk deposition 150 reduces depletion effects in certain embodiments, thereby resulting in higher quality, faster growing germanium films.

Figure 17:
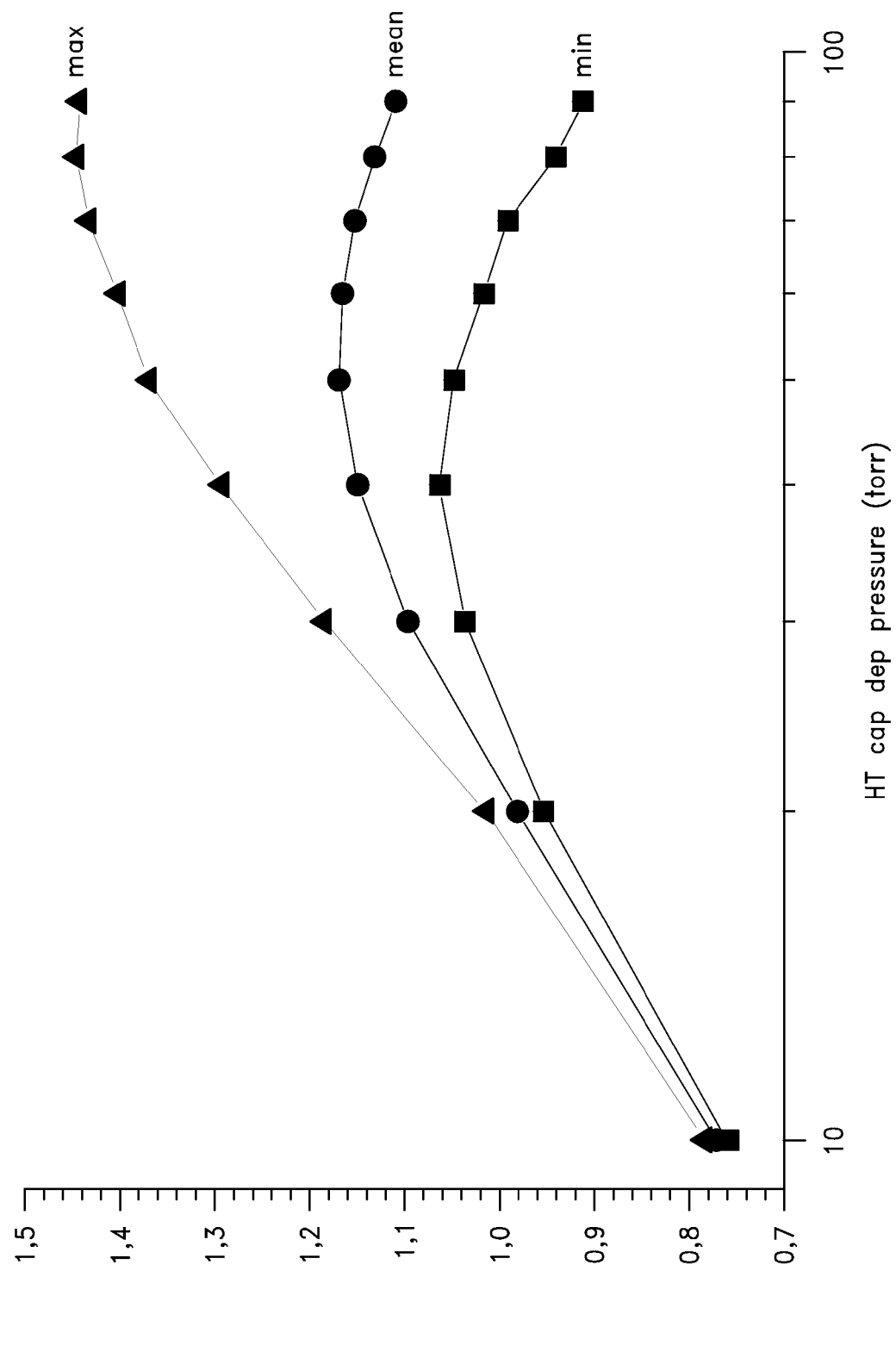
FIG. 17 is a graph illustrating germanium film thickness as a function of reaction chamber pressure during deposition.

FIG. 17 provides a graph illustrating germanium film thickness as a function of reaction chamber pressure during deposition. To obtain the data illustrated in FIG. 17, the bulk deposition 150 was performed for 6 minutes at a temperature of 650° C. using a $GeH_4$ precursor in the reaction chamber with a partial pressure of 20.5 Pa. A $H_2$ carrier flow was provided to the reaction chamber at 5 slm. FIG. 17 illustrates that the pressure in the reaction chamber can have a material effect on the deposition rate during the bulk deposition 150. While FIG. 17 also indicates that tuning the thickness of the germanium film thickness becomes more difficult at higher pressures in certain embodiments, other processing parameters—held constant in FIG. 17—can be adjusted to compensate for this reduction in consistency.

Figure 18:
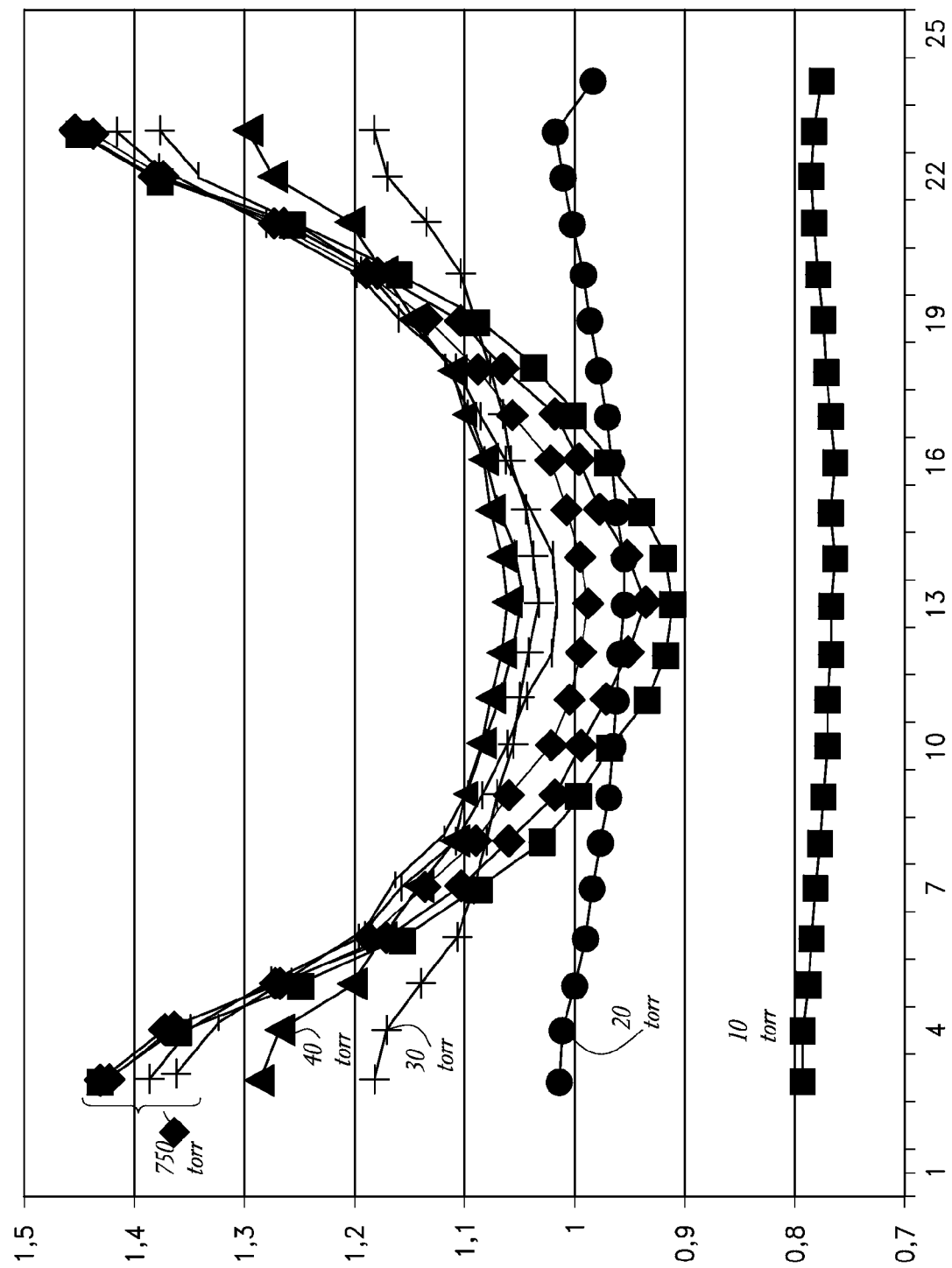
FIG. 18 is a graph illustrating the surface profile of several germanium thin films deposited at different reaction chamber pressures.

FIG. 18 provides a graph illustrating the surface profile of several germanium thin films deposited at different reaction chamber pressures. The horizontal axis provides an arbitrary scale of position across the wafer surface, while the vertical axis provides an arbitrary scale of film depth above the wafer surface. In certain embodiments, deposition at a reduced pressure results in a more uniform film thickness across the surface of the wafer. While FIG. 18 also indicates that uniformity decreases at higher pressures in certain embodiments, other processing parameters—held constant in FIG. 18—can be adjusted to compensate for this reduction in uniformity.

Post-Anneal.

An optional post-anneal operation 160 is performed after the bulk deposition 150. Annealing advantageously permits dislocations to glide out of the germanium layer. In one embodiment of the post-anneal operation 160, the germanium film is held at approximately 930° C., and at atmospheric pressure for approximately five minutes. In another embodiment of the post-anneal operation 160, a thermal cycling annealing process is performed, in which the germanium film is repeatedly heated and cooled for a predetermined time period. In an exemplary embodiment, the post-anneal operation 160 is a spike anneal. For example, in the aforementioned Epsilon® reactors, temperature is capable of being ramped as quickly as 200° C. $sec^{-1}$ until a peak temperature of about 950° C. to about 1150° C. is reached. Even without any plateau annealing, in certain embodiments such a spike anneal is sufficient to drive out defects, particularly in films with high germanium concentration. For example, this is particularly applicable for films with a germanium concentration greater than 20%, such as the illustrated "pure" germanium films disclosed herein, which includes both doped and un-doped germanium films.

Figure 15:
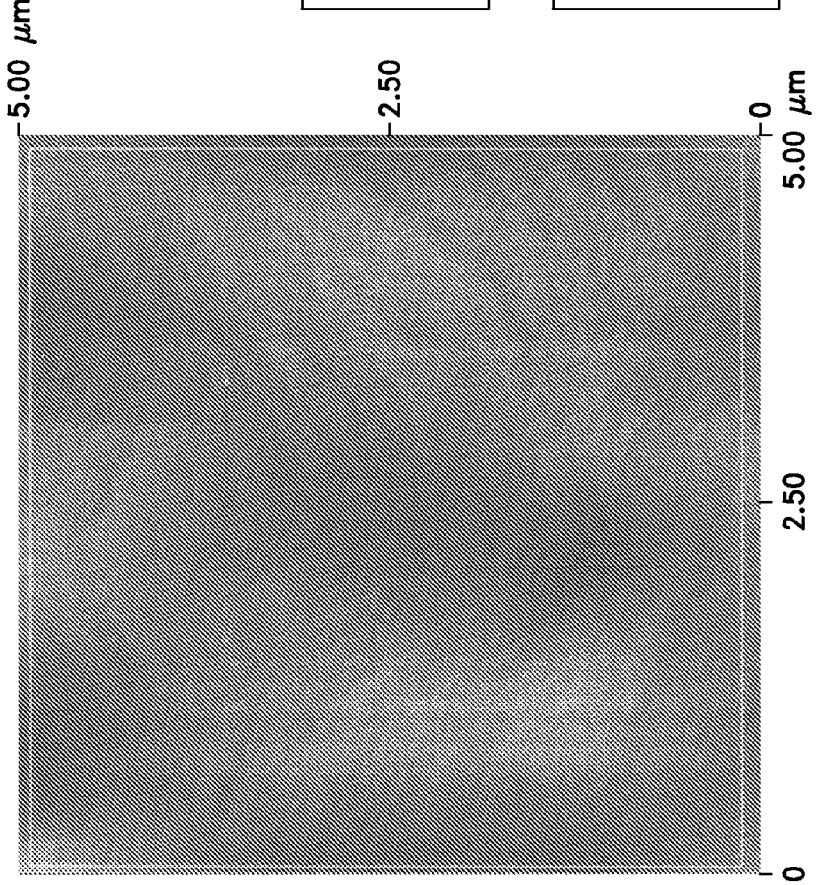
FIG. 15 is an image of a 1.92 µm germanium film formed according to certain of the embodiments disclosed herein, and further subjected to a 15 minute post-anneal operation at 900° C.

FIG. 15 provides an image of a 1.92 µm germanium film formed according to certain of the embodiments disclosed herein, and further subjected to a 15 minute post-anneal operation at 900° C. During the anneal operation, 70 slm of $H_2$ was supplied to the reaction chamber, which was held at approximately 760 torr. The bulk deposition was performed at 650° C. As illustrated, the post-anneal operation provides the film with a roughness between about 3 Å rms and about 4 Å rms.

Figure 16:
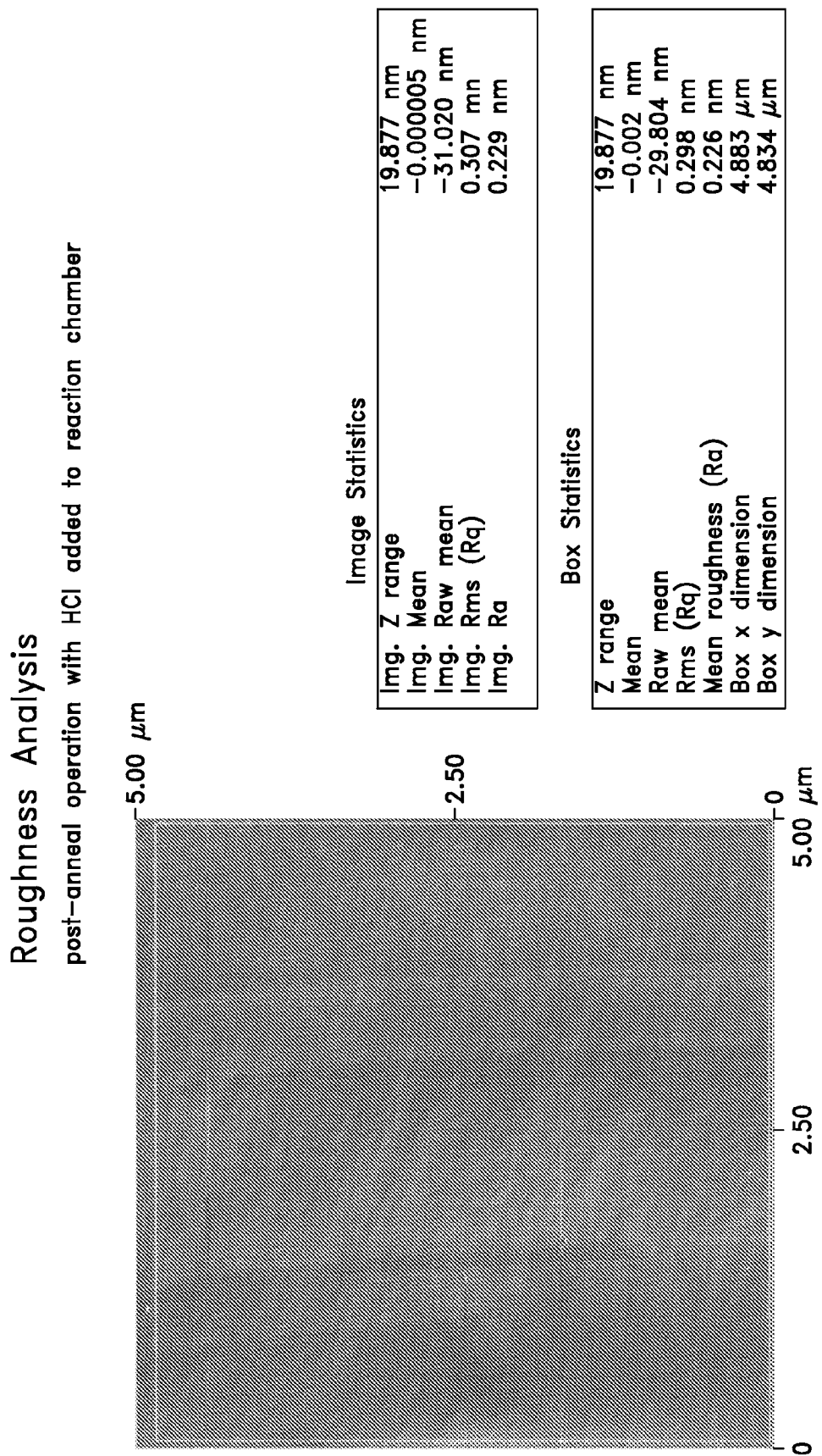
FIG. 16 is an image of a germanium film formed according to certain of the embodiments disclosed herein, and further subjected to a 15 minute post-anneal operation at 900° C. with 200 sccm HCl provided to the reaction chamber during the anneal operation.

FIG. 16 provides an image of a film processed under conditions similar to the film illustrated in FIG. 15, except that 200 sccm HCl was supplied to the reaction chamber during the post-anneal operation. This resulted in approximately 90 nm being etched from the film surface, or about 6 nm $min^{-1}$. As illustrated, this etching process further decreased the roughness of the germanium film.

Film Properties.

Certain embodiments of the techniques disclosed herein create germanium films having advantageous properties, including etch pit density, surface roughness, and film thickness. Included in the figures are surface scans of exemplary etch pit decorated germanium films deposited using the methods disclosed herein. While this invention is not bound by theory, it is believed that germanium films, especially germanium films that are relatively thin, and/or that have a relatively high germanium content, provide a medium in which the gliding propagation of dislocations in the film proceed at a high velocity. See, for example, R. Hull, "Metastable strained layer configurations in the SiGe/Si system," *EMIS Datareviews, Series No. 24: Properties of SiGe and SiGe:C*, edited by Erich Kasper et al., INSPEC, 2000 (London, UK). This benefit is obtainable even without the post-anneal operation, although annealing is optionally performed.

In one embodiment, using the three-stage deposition process disclosed herein, a germanium film having a thickness of approximately 9400 Å is grown in approximately 21 minutes. Overall, including the seed, temperature ramp and bulk deposition stages, the germanium film is preferably deposited at a rate of at least about 300 Å min$^{-1}$, more preferably at least about 500 Å min$^{-1}$.

Preferably, a germanium film having an etch pit density less than approximately $10^6$ cm$^{-2}$ is formed. More preferably, a germanium film having an etch pit density less than approximately $10^5$ cm$^{-2}$ is formed. More preferably, a germanium film having an etch pit density less than approximately $10^4$ cm$^{-2}$ is formed. Most preferably, a germanium film having an etch pit density less than approximately $10^3$ cm$^{-2}$ is formed, as demonstrated in experiments. Lower etch pit densities, such as less than approximately $3 \times 10^2$ cm$^{-2}$, are attainable in highly doped germanium films. The etch pit densities provided in this disclosure are for "as deposited" germanium films, meaning that these etch pit densities are attainable without the benefit of post-deposition treatment (such as annealing or etching). The etch pit density parameters were obtained by creating a surface scan of the germanium film using 35 mL AcOH, 10 mL HNO$_3$, 5 mL HF and 8 mg I$_2$.

Preferably, a germanium film having an "as deposited" surface roughness of less than approximately 20 Å rms is formed. More preferably, a germanium film having a surface roughness of less than approximately 10 Å rms is formed. Most preferably, a germanium film having a surface roughness of less than approximately 3 Å rms is formed, as demonstrated in experiments. In one embodiment, a germanium film having a thickness of approximately 2 μm has a surface roughness of between approximately 2.8 Å rms and approximately 11 Å rms. In an exemplary embodiment, surface roughness of germanium films is determined using atomic force microscopy, and the defect densities and roughness measurements described herein obtain across at least a 10 μm×10 μm window.

Preferably, the epitaxial germanium layer overlying a silicon layer or wafer has a thickness in the range of about 500 Å to about 2 microns. In an exemplary embodiment, the underlying single crystal silicon structure is a wafer.

In one particular embodiment, a germanium film is deposited at between approximately 700 Å min$^{-1}$ and approximately 900 Å min$^{-1}$, has a resultant surface roughness of approximately 2.8 Å rms and a resultant etch pit density of approximately $10^3$ cm$^{-2}$. Particular process conditions used to obtain these results include the general process sequences taught herein, including provision of a surface active compound during cool down. Additionally, the process conditions included use of a three-step germanium deposition, in which a germanium seed layer was deposited at low temperature (for example, at about 350° C. for a germane precursor), followed by temperature ramping to a higher temperature (for example, to between approximately 600° C. and approximately 800° C.) while continuing to flow germane, and continued deposition at the higher temperature. Additionally, hydrogen gas was supplied to the reactor at high flow rates (for example, at about 5 slm or greater) with pressures between approximately 10 torr and approximately 100 torr.

Figure 4:
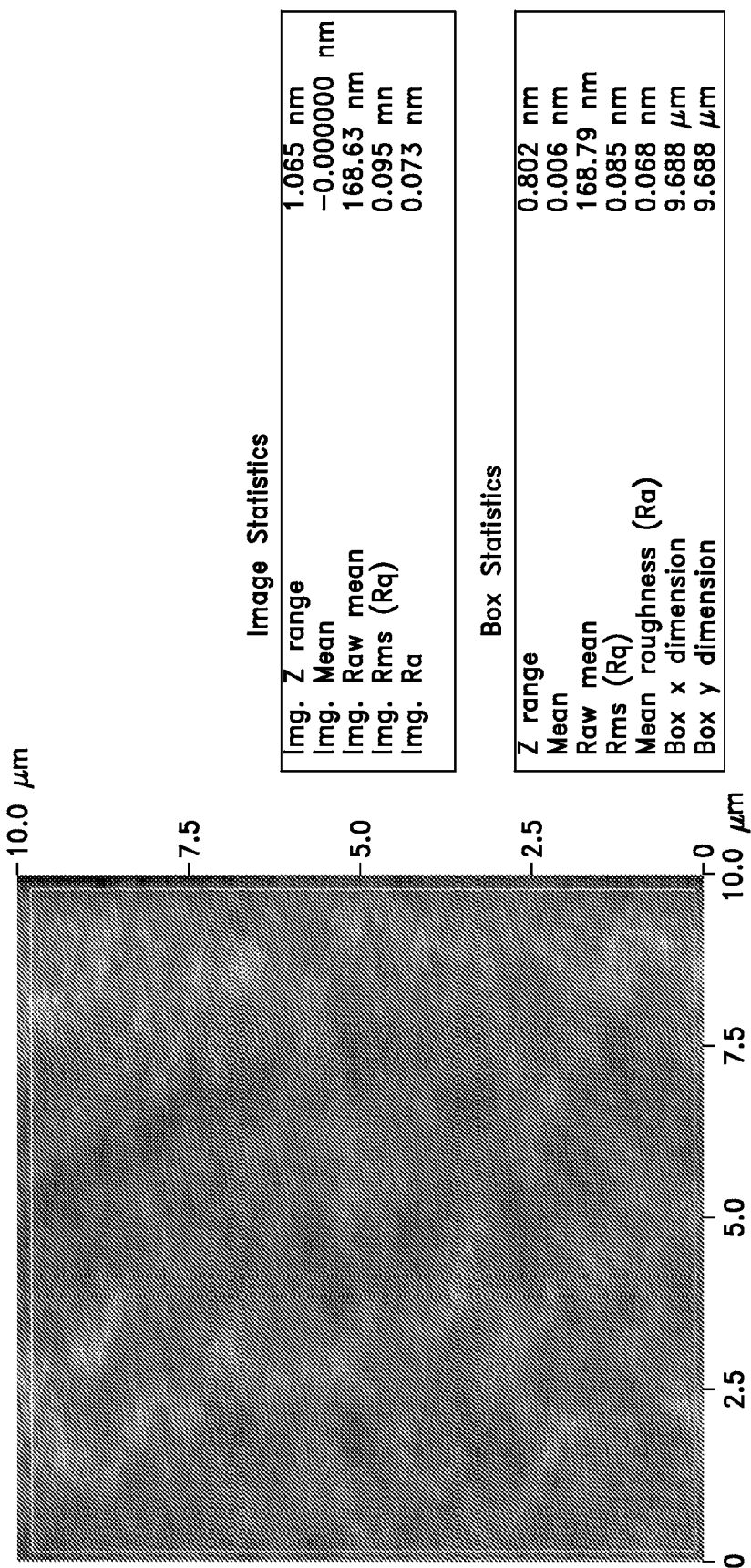
FIG. 4 is an image of a germanium seed layer formed according to certain of the embodiments disclosed herein, and having a surface roughness of 0.85 Å rms.
Figure 5:
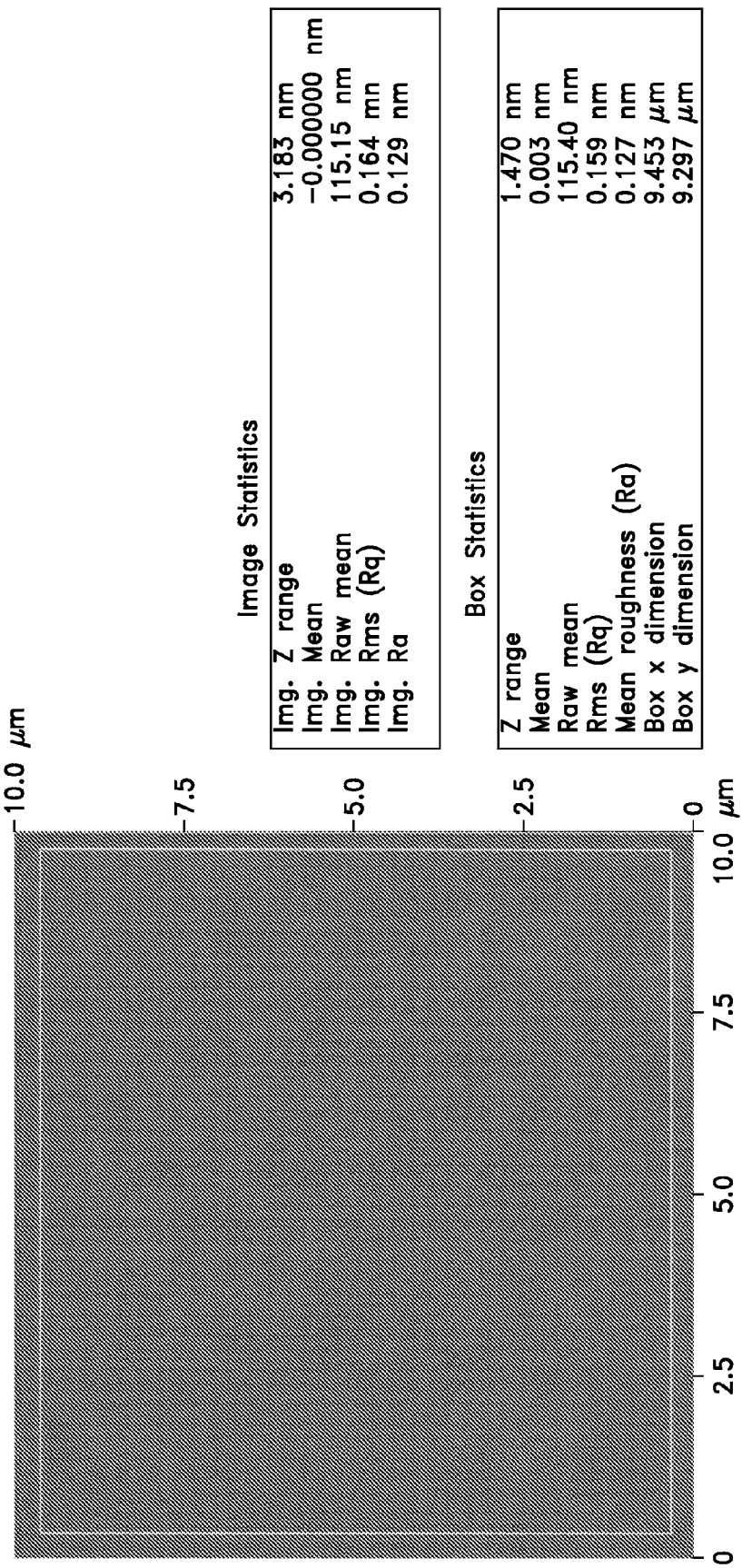
FIG. 5 is an image of a 1.05 µm germanium film formed according to certain of the embodiments disclosed herein, and having a surface roughness of 1.6 Å rms.

The figures include images illustrating selected properties of certain films deposited using the methods disclosed herein. For example, FIG. 4 provides an image of a germanium seed layer formed according to certain of the embodiments disclosed herein, and having a surface roughness of 0.85 Å rms. FIG. 5 provides an image of a 1.05 μm germanium film formed according to certain of the embodiments disclosed herein, and having a surface roughness of 1.6 Å rms.

Certain doped germanium films were formed using the methods disclosed herein. Exemplary surface scans of these films are provided in FIGS. 8 through 13. Such firms were formed in an Epsilon® chamber, as disclosed herein. After a pretreatment bake operation 110, 17 sccm of DCS was bled into the process chamber during a cooling operation 120. A low temperature germanium seed deposition was performed, followed by temperature ramping with continued deposition and higher temperature bulk germanium deposition. Other process conditions included a 30 slm hydrogen purge flow during deposition, 200 sccm of GeH$_4$ (10% in H$_2$) provided as a germanium source, and a chamber pressure of 20 torr. Using these conditions, As, P and intrinsic germanium films were developed.

Figure 8:
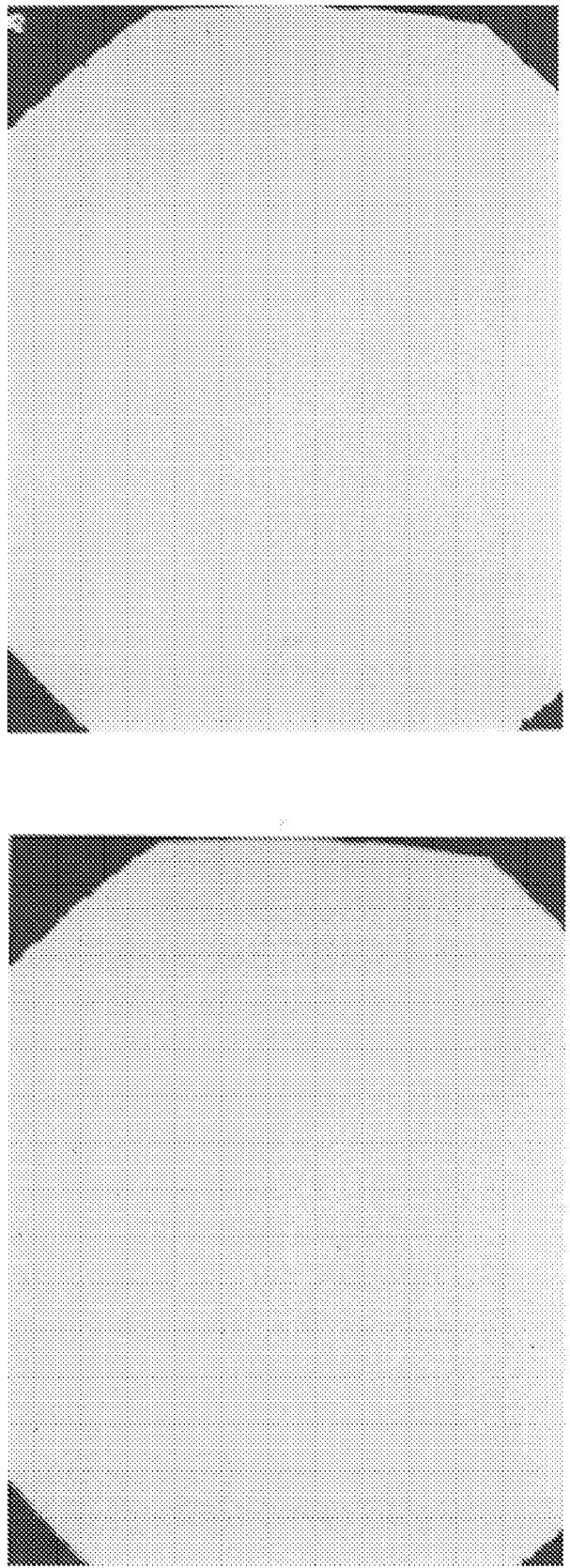
FIG. 8 includes surface scans of etch pit decorated As-doped germanium films deposited in accordance with exemplary embodiments, with 3 sccm arsine (1% in $H_2$) supplied to the reaction chamber during film deposition; the film has less than $10^3$ defects $cm^{-2}$.
Figure 9:
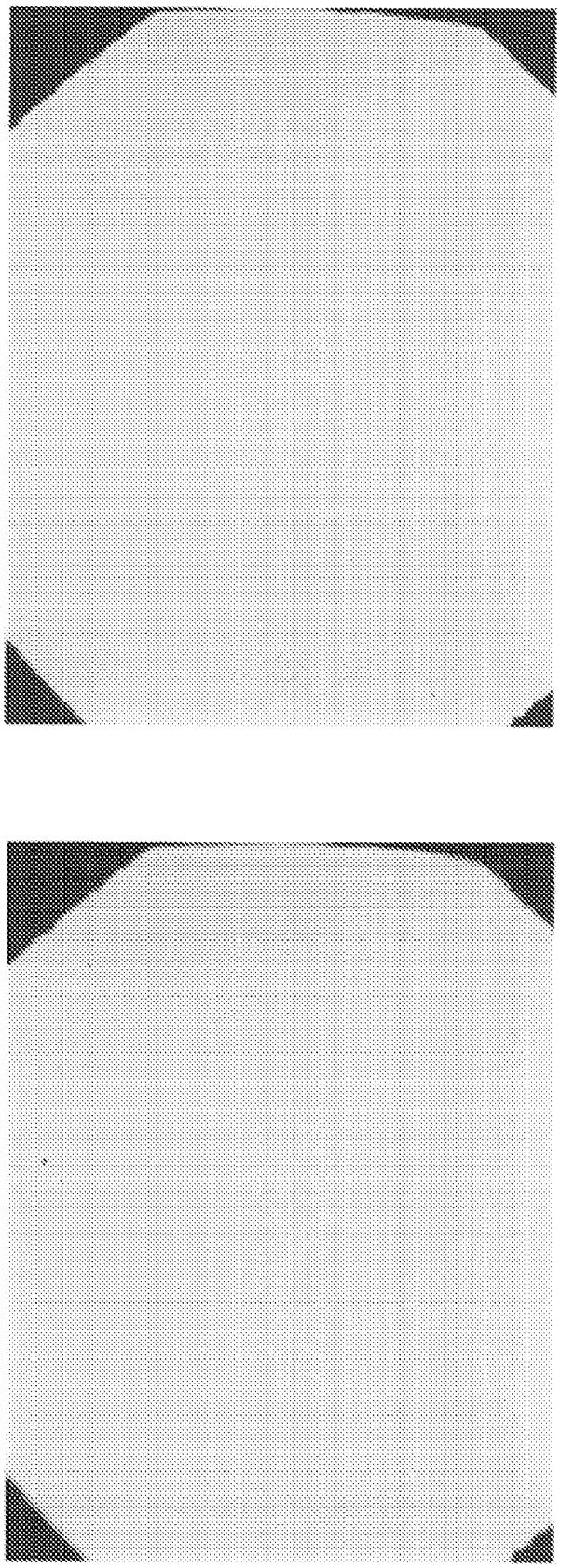
FIG. 9 includes surface scans of etch pit decorated As-doped germanium films deposited in accordance with exemplary embodiments, with 10 sccm arsine (1% in $H_2$) supplied to the reaction chamber during film deposition; the film has less than $10^3$ defects $cm^{-2}$.
Figure 12:
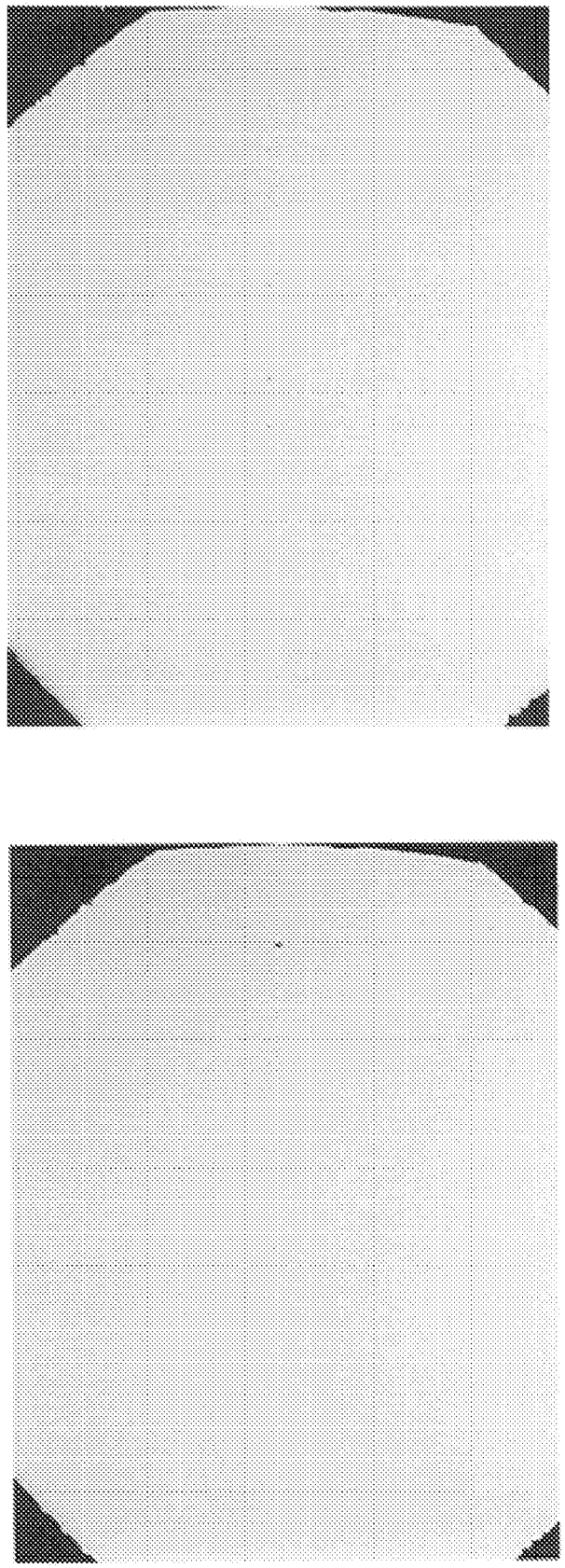
FIG. 12 includes surface scans of etch pit decorated intrinsic germanium films deposited in accordance with exemplary embodiments; the film has less than $10^3$ defects $cm^{-2}$.

Referring now to FIGS. 8 through 12, the scans with "100×" magnification represent a wafer surface 0.93 mm×1.23 mm; scans with "200×" magnification represent a wafer surface 0.46 mm×0.63 mm. FIG. 8 includes surface scans of etch pit decorated As-doped germanium films deposited in accordance with exemplary embodiments, with 3 sccm arsine (1% in H$_2$) supplied to the reaction chamber during film deposition; the film has less than $10^3$ defects cm$^{-2}$. FIG. 9 includes surface scans of etch pit decorated As-doped germanium films deposited in accordance with exemplary embodiments, with 10 sccm arsine (1% in H$_2$) supplied to the reaction chamber during film deposition; the film has less than $10^3$ defects cm$^{-2}$. FIG. 10 includes surface scans of etch pit decorated As-doped germanium films deposited in accordance with exemplary embodiments, with 30 sccm arsine (1% in H$_2$) supplied to the reaction chamber during film deposition; the film has less than $10^3$ defects cm$^{-2}$. FIG. 11 includes surface scans of etch pit decorated P-doped germanium films deposited in accordance with exemplary embodiments, with 1 sccm phosphine (1% in H$_2$) supplied to the reaction chamber during film deposition; the film has less than $10^3$ defects cm$^{-2}$. FIG. 12 includes surface scans of etch pit decorated intrinsic germanium films deposited in accordance with exemplary embodiments; the film has less than $10^3$ defects cm$^{-2}$.

Figure 13:
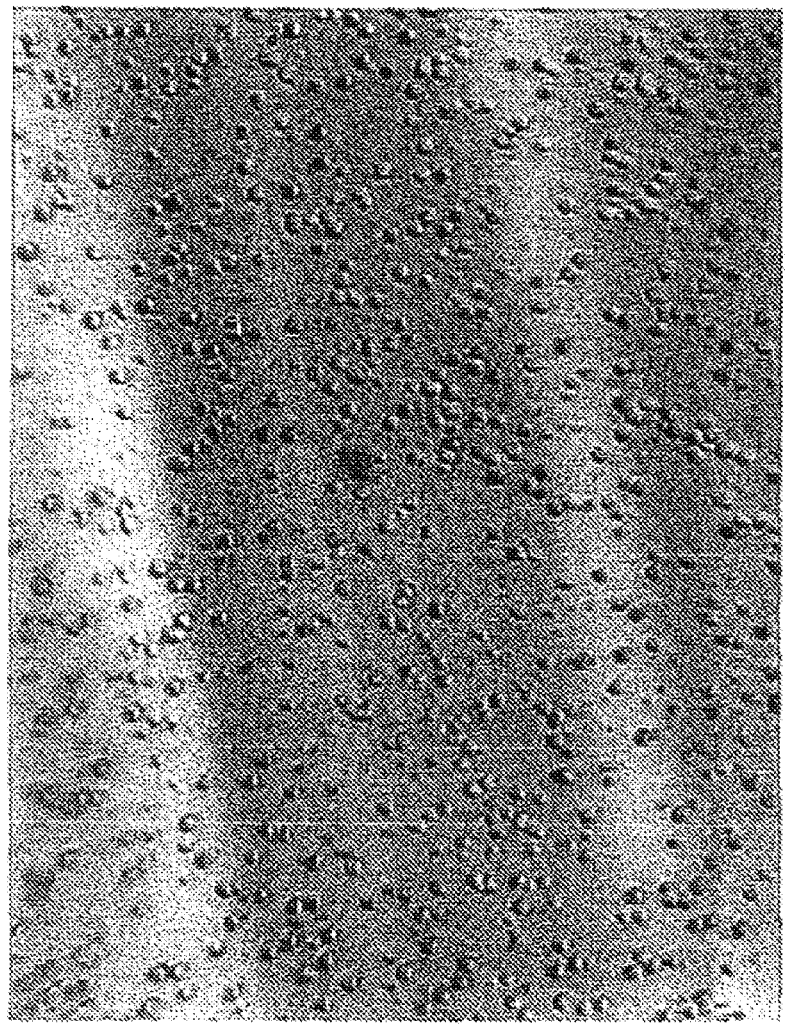
FIG. 13 is an image of an etch pit decorated germanium film deposited in accordance with an exemplary embodiment, illustrating about $10^7$ defects $cm^{-2}$; the film was etched by using 35 mL AcOH, 10 mL $HNO_3$, 5 mL HF and 8 mg $I_2$, and is shown in 1000× magnification of a surface 108 µm×82 µm.

FIG. 13 provides a surface scan of an etch pit decorated germanium film deposited in accordance with an exemplary embodiment, illustrating about $10^7$ defects cm$^{-2}$. The film was etched by using 35 mL AcOH, 10 mL HNO$_3$, 5 mL HF and 8 mg I$_2$, and is shown in 1000× magnification of a surface 108 μm×82 μm.

The black spots visible on the surfaces shown in FIGS. 8 through 13 represent defects that have been decorated due to the etch process, described herein with respect to FIG. 13. This technique allows a defect density per unit area to be calculated. The surface scans provided in FIGS. 8 through 13 show etch pit densities on the order of $10^3$ cm$^{-2}$ or lower, including etch pit densities less than $10^2$ cm$^{-2}$.

Figure 14:
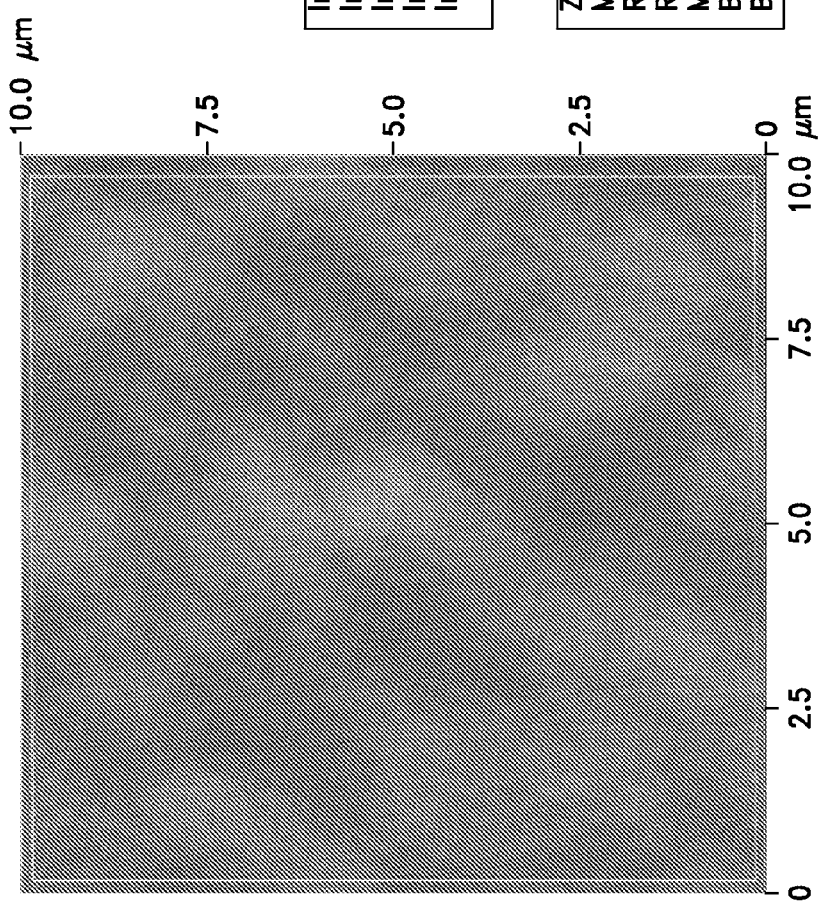
FIG. 14 is an image of a P-doped germanium film formed according to certain of the embodiments disclosed herein, and having a surface roughness of approximately 2.81 Å rms.

FIG. 14 provides an image of a P-doped germanium film formed according to certain of the embodiments disclosed herein, and having a surface roughness of approximately 2.81 Å rms. This film was produced using a technique similar to that described above for the films illustrated in FIGS. 8 through 13. For the film illustrated in FIG. 13, 1 sccm phosphine (1% in H$_2$) was supplied to the reaction chamber during film deposition.

As used herein, terms such as "silicon," "silicon-germanium," "Si," and "SiGe," are terms of art used to show that the material comprises the indicated elements, and are not to be construed as limiting the relative proportions of those elements nor as excluding the presence of other elements. Thus, for example, a "germanium film" or a "germanium layer" may contain germanium in various proportions with other elements, or may contain only germanium. Single crystal germanium (for example, epitaxial germanium) is highly pure (>99.9% germanium) and single crystal silicon (for example, epitaxial silicon) is also highly pure (>99.9% silicon), and both may be un-doped or doped with electrically active dopants and other usual trace impurities.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than deposition of germanium films.

We claim:

1. A method comprising:
   in a reaction chamber being held at a first pressure, depositing a seed layer of germanium over a silicon-containing surface at a first temperature;
   after depositing the seed layer, increasing the temperature of the seed layer while continuing to deposit germanium; and
   holding the seed layer in a second temperature range and at a second pressure while continuing to deposit germanium, wherein the second temperature range is greater than the first temperature, and wherein the second pressure is lower than the first pressure.

2. The method of claim 1, wherein the silicon-containing surface is a substrate having a miscut.

3. The method of claim 1, wherein the second pressure is between about 90 torr and about 50 torr less than the first pressure.

4. The method of claim 1, wherein the second pressure is between about 80 torr and about 60 torr less than the first pressure.

5. The method of claim 1, wherein the second pressure is between about 10 torr and about 40 torr.

6. The method of claim 1, wherein the first pressure is between about 100 torr and about 10 torr.

7. A method comprising:
   providing a purge gas flow through a reaction chamber, wherein the purge gas comprises $H_2$;
   depositing a seed layer of germanium over a silicon-containing substrate at a first temperature while the purge gas is flowing through the reaction chamber at a first flow rate;
   after depositing the seed layer, increasing the temperature of the substrate while continuing to deposit germanium; and
   holding the substrate in a second temperature range while continuing to deposit germanium, and while flowing the purge gas through the reaction chamber at a second flow rate, wherein the second temperature range is greater than the first temperature, and wherein the second flow rate is greater than the first flow rate.

8. The method of claim 7, further comprising:
   performing a baking process to remove oxidation products from the silicon-containing substrate; and
   cooling the silicon-containing substrate to the first temperature after the baking process and before depositing the seed layer; and
   flowing the purge gas through the reaction chamber at a third flow rate while the silicon-containing substrate is cooling, wherein the third flow rate is greater than the first flow rate.

9. The method of claim 7, wherein the seed layer is deposited to a thickness between about 1 monolayer and about 1000 Å.

10. The method of claim 7, wherein the seed layer is deposited for a duration of less than about three minutes.

11. The method of claim 7, wherein the deposited germanium has a surface roughness of less than approximately 3 Å rms.

12. The method of claim 7, wherein the deposited germanium has an etch pit density of less than approximately $10^3$ $cm^{-2}$.

13. A method comprising:
   in a reaction chamber, depositing a seed layer of germanium over a silicon-containing substrate at a first temperature;
   after depositing the seed layer, increasing the temperature of the substrate while continuing to deposit germanium thereon;
   holding the substrate in a second temperature range while continuing to deposit germanium thereon, wherein the second temperature range is greater than the first temperature; and
   supplying a chlorine source to the reaction chamber while the substrate is being held in the second temperature range, wherein the chlorine source is a chlorogermane.

14. The method of claim 13, further comprising supplying the chlorine source to the reaction chamber while increasing the temperature of the substrate.

15. The method of claim 13, wherein the chlorine source is supplied to the reaction chamber at a flow rate between approximately 25 sccm and about 200 sccm.

* * * * *